United States Patent
Yamamoto et al.

(10) Patent No.: US 7,079,860 B1
(45) Date of Patent: Jul. 18, 2006

(54) SEMICONDUCTOR APPARATUS AND COMMUNICATION APPARATUS

(75) Inventors: Shinji Yamamoto, Osaka (JP);
Kaname Motoyoshi, Nishinomiya (JP);
Shinji Fukumoto, Ibaraki (JP); Kenichi Hidaka, Osaka (JP); Atsushi Watanabe, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/913,886

(22) PCT Filed: Mar. 14, 2000

(86) PCT No.: PCT/JP00/05121

§ 371 (c)(1),
(2), (4) Date: Aug. 21, 2001

(87) PCT Pub. No.: WO00/55967

PCT Pub. Date: Sep. 21, 2000

(30) Foreign Application Priority Data

Mar. 15, 1999 (JP) .................................. 11-068252

(51) Int. Cl.
*H04B 1/06* (2006.01)
(52) U.S. Cl. .............................. 455/552.1; 455/114.3; 455/343.1; 455/252.1
(58) Field of Classification Search .............. 455/252.1, 455/114.3, 121, 127.4, 193.1, 552.1, 574, 455/343.1, 572
See application file for complete search history.

(56) References Cited

U.S. PATENT DOCUMENTS 5,459,428 A 10/1995 Kim et al.
6,066,993 A 5/2000 Yamamoto et al.
6,259,901 B1 * 7/2001 Shinomiya et al. ...... 455/127.3
6,766,156 B1 * 7/2004 Hayashihara ............... 455/295

FOREIGN PATENT DOCUMENTS

| EP | 0 678 975 A1 | 10/1995 |
| JP | 2679495 B2 | 8/1997 |
| JP | 10-65466 A | 3/1998 |
| JP | 10-313259 A | 11/1998 |

* cited by examiner

OTHER PUBLICATIONS

International Search Report dated Jun. 20, 2000.

*Primary Examiner*—Ahmad F. Matar
*Assistant Examiner*—Karen L. Le
(74) *Attorney, Agent, or Firm*—McDermott Will & Emery LLP

(57) ABSTRACT

A first low noise amplifier (LNA1 111) is provided with a control terminal (1115) for turning of/off the low noise amplifier (LNA1 111). Power terminals of the low noise amplifier (LNA1 111) and a second low noise amplifier (LNA2 112) are commonly connected, and are connected to a power supply (10) via a power supply switch (1114). Ground terminals of the two amplifiers (LNA1 111) and (LNA2 112) are commonly connected, and a constant current source (1 115) is connected between the common terminal and the ground. The amplifiers (LNA1 111) and (LNA2 112) are turned on/off by switching the voltage applied to the control terminal (1115) of the first low noise amplifier (LNA1 111) between a high potential and a low potential. The power supply switch (1114) is turned off during signal transmission. Therefore, an LNA block can be provided by using only one power supply switch (1114), whereby it is possible to reduce the number of devices from that in the prior art, thereby realizing a reduction in the size thereof.

15 Claims, 33 Drawing Sheets

| CONTROL TERMINAL 1115 | CONTROL TERMINAL 1135 | LNA1 | LNA2 | LNA3 |
|---|---|---|---|---|
| HIGH | LOW | ON | OFF | OFF |
| LOW | HIGH | OFF | OFF | ON |
| LOW | LOW | OFF | ON | OFF |

SEMICONDUCTOR APPARATUS AND COMMUNICATION APPARATUS

TECHNICAL FIELD

The present invention relates to a high frequency semiconductor apparatus and a high frequency communication apparatus for use in radio equipment.

BACKGROUND ART

In recent years, active researches have been conducted on dual-band portable telephones using two communication systems for one terminal in order to ensure a sufficient number of communication channels. Since a dual-band portable telephone uses two frequency bands, it requires two of each of the following components that are normally required in a high frequency block: low noise amplifier (Low Noise Amplifier; hereinafter referred to as "LNA"); power amplifier (Power Amplifier; hereinafter referred to as "PA"); down-mixer (Down Mixer; hereinafter referred to as "D-Mix"); up-mixer (up Mixer; hereinafter referred to as "U-Mix"); and local signal generator (voltage Controlled Oscillator; hereinafter referred to as "VCO"), and it also requires a power switch for operating these components in a time division manner, a reception path switch (hereinafter referred to as "RX-SW") for switching the reception path, a transmission path switch (hereinafter referred to as "TX-SW") for switching the transmission path, etc.

FIG. 32 illustrates an example of a high frequency block of a conventional dual-band portable telephone. In FIG. 32, 101 denotes an antenna (hereinafter referred to as "ANT"), 102 denotes a 1-input/4-output antenna switch (hereinafter referred to as "ANT-SW"), 111 denotes an LNA1, 112 denotes an LNA2, 121 denotes a D-Mix1, 122 denotes a D-Mix2, 131 denotes a U-Mix1, 132 denotes a U-Mix2, 141 denotes a PA1, 142 denotes a PA2, 151 denotes a VC01, 152 denotes a VC02, 161 denotes an RX-SW, and 162 denotes a TX-SW.

The operation of the high frequency block illustrated in FIG. 32 will now be described briefly.

The ANT 101 catches radio wave in the air and guides it into the telephone. The ANT-SW 102 connects one of the four signal paths RX1, RX2, TX1 and TX2 to the ANT 101.

Next, the operation of the reception side will be described. The following description will be made with respect to the signal path RX1 for example. A signal having a frequency fRX1 that is received at the ANT 101 is amplified by the LNA1 111 and passed to the D-Mix1 121. The VC01 151 generates a signal having a frequency fLO1, and fRX1 and fLO1 are mixed together at the D-Mix1 121, thus being down-converted to a frequency fIF. At this time, the absolute value of fRX1–fLO1 is fIF. The operation of the LNA2 112 and the D-Mix2 122 in the signal path RX2 is just as described above, wherein a frequency fRX2 received at the ANT 101 and a frequency fLO2 generated by the VC02 152 are mixed together at the D-Mix2 122, thus being down-converted to the frequency fIF. At this time, the absolute value of fRX2–fLO2 is fIF. While the RX-SW 161 switches between signals from the D-Mix1 121 and the D-Mix2 122, the subsequent circuit components after the RX-SW 161 can be shared because the frequencies of the output terminals of the D-Mixes are both fIF.

Next, the operation of the transmission side will be described. The following description will be made with respect to the signal path TX1 for example. While the TX-SW 162 is switched so as to input a signal to either one of the U-Mix1 131 and the U-Mix2 132, the frequency of the signal is fMOD in either case. The VC01 151 generates a signal having the frequency fLO1, and the signals having the frequencies fMOD and fLO1 are mixed together at the U-Mix1 131, thus being up-converted to a frequency fTX1. At this time, the sum of fLO1 and fMOD is fTX1. The PA1 141 amplifies the signal having the frequency fTX1 from the U-Mix1 131 to the antenna transmission output. The operation of the U-Mix2 132 and the PA2 142 in the signal path TX2 is just as described above, wherein the sum of fLO2 and fMOD is fTX2.

Now, the configuration of the LNA block of the dual-band portable telephone will be described in detail with particular focus on the LNA block in FIG. 32.

FIG. 33 illustrates an example of an LNA block of a conventional dual-band portable telephone. 10 denotes a power supply, 1111 denotes an input terminal of the LNA1 111, 1121 denotes an input terminal of the LNA2 112, 1112 denotes an output terminal of the LNA1 111, 1122 denotes an output terminal of the LNA2 112, 1114 denotes a power supply SW of the LNA1 111, 1124 denotes a power supply SW of the LNA2 112. In FIG. 33, the peripheral matching components, etc., are omitted, and each area surrounded by a broken line denotes an individual device. This also applies to other drawings discussed below.

The power supply SW of the LNA1 1114 is connected between a power supply terminal of the LNA1 111 and the power supply 10, and turns on/off the power supply of the LNA1 111. The power supply SW of the LNA2 1124 is connected between a power supply terminal of the LNA2 112, and turns on/off the power supply of the LNA2 112. The respective ground terminals of the LNA1 111 and the LNA2 112 are both connected to the ground.

In a portable telephone, it is important to reduce the power consumption thereof in order to ensure a long calling time. Therefore, the power supply of a device that is not being operated is typically turned off. Specifically, when the LNA1 111 is operated, the power supply of the LNA2 112 is turned off. Therefore the power supply SW 1114 is turned on and the power supply SW 1124 is turned off. Conversely, when the LNA2 112 is operated, the power supply of the LNA1 111 is turned off. Therefore, the power supply SW 1124 is turned on and the power supply SW 1114 is turned off. Moreover, during transmission, neither the LNA1 111 nor the LNA2 112 needs to be turned on. Therefore, both of the power supply SWs 1114 and 1124 are turned off.

Typically, a 3- to 4-terminal device such as a transistor or a regulator is used as a power supply SW, and a 3- to 4-terminal device such as an Si bipolar transistor or a GaAs FET is used as an LNA. Therefore, the LNA block as a whole requires a total of 4 devices, i.e., two 3- to 4-terminal devices as power supply SWs and two 3- to 4-terminal devices as LNAS. Moreover, this directly applies to the other three blocks, i.e., PA, D-Mix and U-Mix, as well as the LNA block, and a total of four devices, i.e., two power supply SWs and two amplification devices such as transistors are required for each block.

Thus, when producing a dual-band portable telephone using a conventional device, it requires twice as many components as those for a single-band portable telephone. As a result, the mounting area on the substrate increases, whereby it is difficult to reduce the size of the terminal.

An object of the present invention is to reduce the number of components in a high frequency block of a dual-band portable telephone so as to realize a reduction in the size of the dual-band portable telephone.

DISCLOSURE OF THE INVENTION

In order to achieve the above object, the present invention provides a communication apparatus such as a dual-band portable telephone in which a plurality of LNAs or D-Mixes provided in an LNA block, a D-Mix block, etc., can be selectively switched from one to another without using a power supply SW.

Specifically, a semiconductor apparatus of the invention of claim 1 includes, on a same semiconductor substrate: two or more semiconductor devices to which two or more signals having different frequency ranges are input, respectively; and a constant current source commonly connected to one ends of the semiconductor devices, wherein at least one of the semiconductor devices is provided with a control terminal for turning on/off the semiconductor device.

The invention of claim 2 is the semiconductor apparatus of claim 1, wherein each of the semiconductor devices is a power amplification device.

The invention of claim 3 is the semiconductor apparatus of claim 1, wherein each of the semiconductor devices is a frequency conversion device.

The invention of claim 4 is the semiconductor apparatus of claim 2, wherein the power amplification device is provided by using a field effect transistor.

The invention of claim 5 is the semiconductor apparatus of claim 3, wherein the frequency conversion device is provided by using a dual-gate type field effect transistor.

The invention of claim 6 is the semiconductor apparatus of claim 1, 2 or 3, including a power supply switch commonly connected to other ends of the semiconductor devices.

The invention of claim 7 is the semiconductor apparatus of claim 1, 2 or 3, wherein a constant current value of the constant current source is set to a current value needed for the semiconductor device requiring a lowest distortion among the two or more semiconductor devices.

The invention of claim 8 is the semiconductor apparatus of claim 1, 2 or 3, wherein a constant current value of the constant current source is set to a current value needed for the semiconductor device receiving a signal of a highest frequency range among the two or more semiconductor devices.

The invention of claim 9 is the semiconductor apparatus of claim 1, 2 or 3, wherein the constant current source is provided by using a field effect transistor and a resistor.

The invention of claim 10 is the semiconductor apparatus of claim 1, 2 or 3, wherein the two or more semiconductor devices and the constant current source are sealed in a same package.

The invention of claim 11 is the semiconductor apparatus of claim 1, 2 or 3, wherein output terminals of the two or more semiconductor devices are commonly connected and shared, with an output side return loss being less than or equal to −6 dB over an entire extent of each frequency range.

The invention is the semiconductor apparatus, wherein a grounded capacitor is connected in parallel to the constant current source.

The invention is the semiconductor apparatus, wherein an impedance value of the grounded capacitor for a frequency of the signal having a lowest frequency range among the two or more input signals is set to be sufficiently small for an impedance value of the constant current source.

The invention is the semiconductor apparatus, wherein an inductor is connected to a source of the field effect transistor.

The invention is the semiconductor apparatus, wherein the inductor is arranged in series with the grounded capacitor.

The invention is the semiconductor apparatus, wherein the constant current source is provided with a control terminal for turning on/off the constant current source.

A communication apparatus of the invention includes a semiconductor apparatus of claim 1 and an antenna, wherein the two or more signals having different frequency ranges that are received by the antenna are input to the respective semiconductor devices, or two or more signals having different frequency ranges that have been processed by the semiconductor devices are output from the antenna.

According to the invention, with the above-described configuration, a plurality of semiconductor devices are turned on/off based on the voltage applied to a control terminal provided in at least one of the semiconductor devices, thereby allowing for free selection of any one of the plurality of semiconductor devices. Therefore, only one power supply SW is required while the prior art required the same number of power supply SWs as the number of semiconductor devices, and the plurality of semiconductor devices and the constant current source can be packaged into a single device. Thus, the number of components is reduced, thereby realizing a reduction in the size of the portable terminal.

According to the invention, an output terminal is shared by a plurality of semiconductor devices, thereby reducing the number of terminals of a single packaged device.

Furthermore, according to the invention, in a case where each semiconductor device is provided by using a field effect transistor, the source terminal of the field effect transistor is grounded for high frequencies and opened for direct currents by a grounded capacitor, thereby improving the high frequency characteristics.

In addition, according to the invention, a source inductor makes it possible to improve the stability factor of the field effect transistors while ensuring a desirable gain of the field effect transistors, thereby achieving both a low noise figure and a desirable input return loss in the field effect transistors.

Furthermore, according to the invention, the power supply SW is eliminated, and the semiconductor block can be provided by using only one device, thereby further reducing the number of components and realizing a reduction in the size of a portable terminal.

BEST MODE FOR CARRYING OUT THE INVENTION

Embodiments of the present invention will now be described with reference to the drawings.

Note that the following embodiments only deal with the LNA block and the D-Mix block of a dual-band portable telephone. While the PA block handles a power greater than that handled by the LNA block, the circuit configuration of the PA block is totally the same as that of the LNA block, and while the frequencies input to the respective terminals of the U-Mix block are different from those for the D-Mix block, the circuit configuration of the U-Mix block is the same as that of the D-Mix block. Therefore, the PA block and the U-Mix block will not be described below.

First Embodiment

Figure 1:
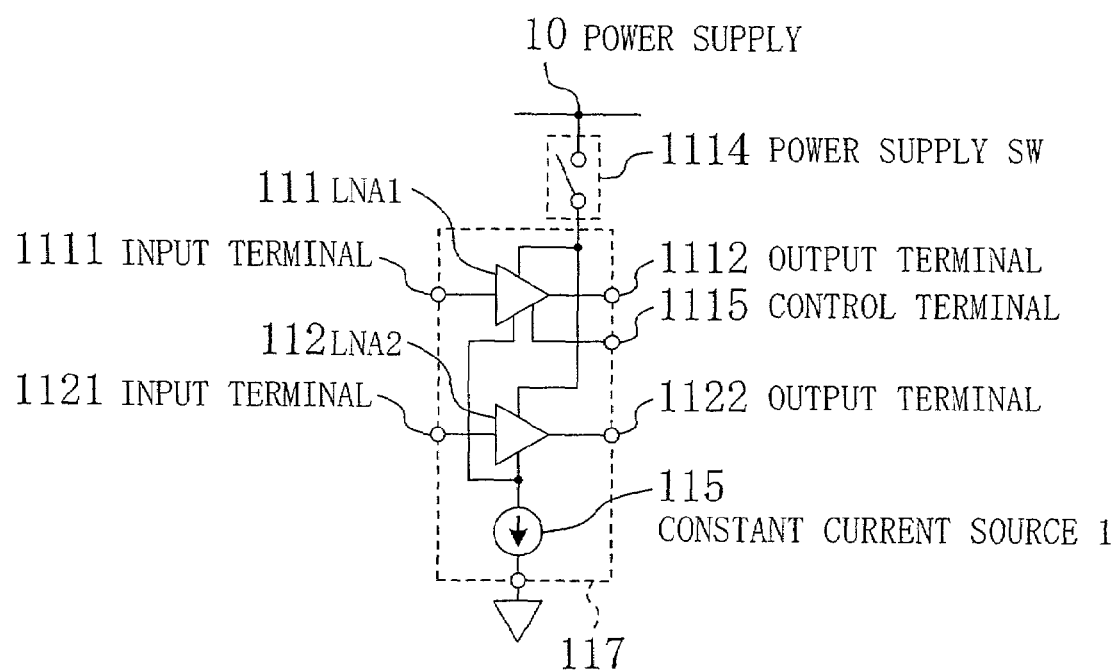
FIG. 1 is a diagram illustrating a configuration of an LNA block of a dual-band portable telephone according to the first embodiment of the present invention.

FIG. 1 illustrates a configuration of an LNA block according to the first embodiment of the present invention, which is provided in a dual-band portable telephone as a communication apparatus. In FIG. 1, 111 denotes a first LNA1 (a semiconductor device and power amplifier device), 112 denotes a second LNA2 (a semiconductor device and power amplifier device), 10 denotes a power supply, 1114 denotes a power supply SW, and 115 denotes a constant current source 1. Moreover, 1111 denotes an input terminal of the first LNA1 111, 1112 denotes an output terminal of the first LNA1 111, 1121 denotes an input terminal of the second LNA2 112, and 1122 denotes an output terminal of the second LNA2 112.

The power supply terminals of the first LNA1 111 and the second LNA2 112 are commonly connected, and the power supply SW 1114 is connected between the common terminal and the power supply 10. Moreover, the ground terminals of the first LNA1 111 and the second LNA2 112 are commonly connected, and the constant current source 1 115 is connected between the common terminal and the ground. Furthermore, the input terminal 1111 and the output terminal 1112 of the first LNA1 and the input terminal 1121 and the output terminal 1122 of the second LNA2 are each independent as a terminal. High frequency signals having different frequency ranges from each other are respectively input to the first LNA1 111 and the second LNA2 112. The frequency ranges of the high frequency signals may either partially overlap with each other, or be entirely different with no overlap.

Of the first LNA1 111 and the second LNA2 112, the first LNA1 111 is provided with a control terminal 1115 for turning on/off the first LNA1 111. When the potential of the control terminal 1115 is high, the first LNA1 111 is turned on, and when it is low, the first LNA1 111 is turned off.

As shown in FIG. 1 surrounded by a broken line, the first LNA1 111, the second LNA2 112 and the constant current source 1 115 together form a circuit device 117 integrated on the same semiconductor substrate, and the circuit device 117 is sealed in a single package.

Next, the operation of the LNA block illustrated in FIG. 1 will be described. Now, it is assumed that the constant current value of the constant current source 1 115 is I1. With the configuration of FIG. 1, the sum of the current of the first LNA1 111 and the current of the second LNA2 112 is always the constant current value I1 because of the constant current source 1 115. Therefore, when a low potential is applied to the control terminal 1115 of the first LNA1 111, the first LNA1 111 is turned off, whereby the current value thereof is "0". At this time, the current value of the second LNA2

112 is the constant current value I1, whereby the second LNA2 112 is turned on. Conversely, when a high potential is applied to the control terminal 1115 of the first LNA1 111, the first LNA1 111 is turned on, whereby the current value of the first LNA1 111 is equal to the constant current value I1, and the second LNA2 112 is turned off with the current value thereof being "0". Thus, the two LNAs 111 and 112 can be switched from one to another based on the voltage applied to the control terminal 1115 of the first LNA1 111 without using the power supply SW 1114. Note that during transmission, the power supply SW 1114 is turned off (closed), thereby turning off both of the LNAs 111 and 112.

The constant current value I1 of the constant current source 1 115 will be described. For an LNA, there exists a minimum current consumption that satisfies the specifications of the high frequency characteristics such as gain and distortion. When an operating current of a value that is greater than the minimum current consumption value is allowed to flow, the high frequency characteristics are basically improved, but there will be a waste of current. Now, assuming that the minimum current consumptions of the first LNA1 111 and the second LNA2 112 are I1min and I2min, respectively, it is most desirable in the present embodiment that I1min=I2 min holds. In such a case, the constant current value I1 of the constant current source 1 115 is set to I1min=I2 min=I1. By this setting, there will be no waste of current consumption.

On the other hand, when the third order intermodulation distortions of the two LNAs, i.e., the LNA1 111 and the LNA2 112, differ from each other, the minimum current consumption values required for the LNA1 111 and the LNA2 112 also differ from each other. In such a case, the minimum current consumption value required for the LNA that has the lower third order intermodulation distortion is greater than the minimum current consumption value of the other LNA of the higher distortion. Therefore, when the minimum current consumption values of the LNAs differ from each other, the constant current value I1 of the constant current source 1 115 is set to coincide with the minimum current consumption value of the LNA having the lower third order intermodulation distortion. In such a case, when the LNA having the higher third order intermodulation distortion is on, a waste of current in excess of the minimum current consumption value thereof flows through the LNA. Therefore, it is desirable to bring the minimum current consumption values of the LNAs closer to being equal to each other (I1min=I2min) by changing the device parameters of the LNA1 111 and the LNA2 112 such as gate length and gate width.

Figure 30A:
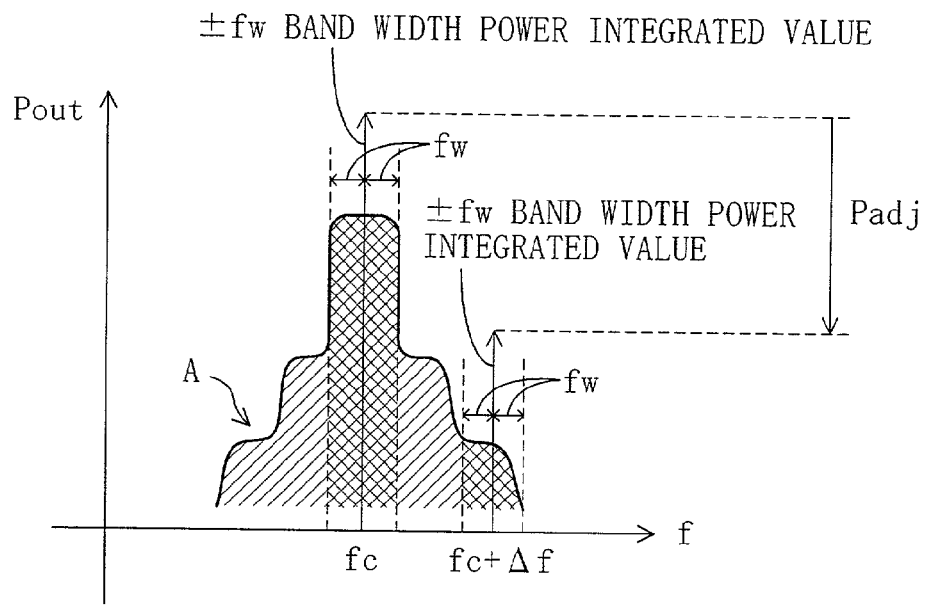
FIGS. 30(a) and 30(b) show diagrams each illustrating an adjacent channel leak power which defines the distortion of a digital modulation type power amplifier.
Figure 30B:
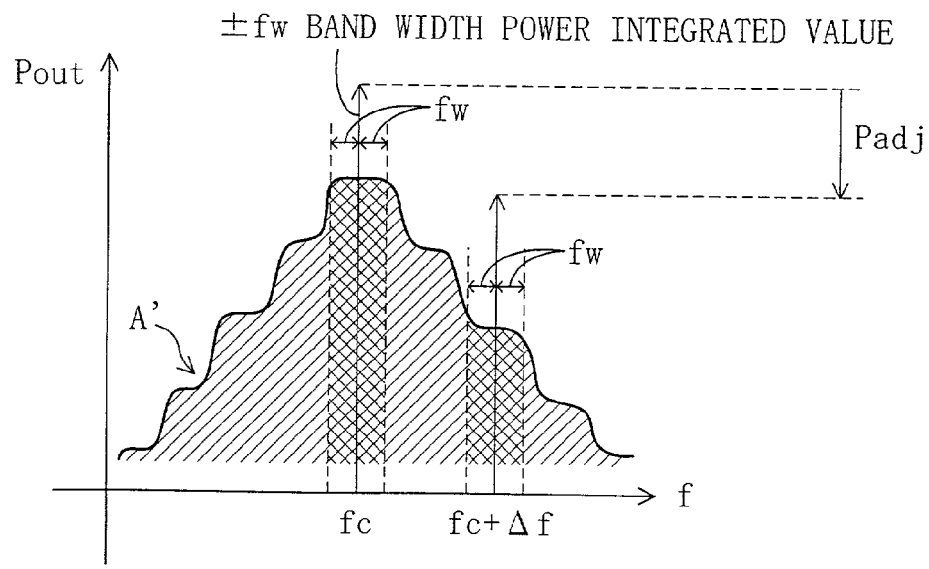

Note that while a case where an LNA is used as a semiconductor device is described in the present embodiment, the present invention can similarly be applied to cases where a PA is used as a semiconductor device. In such a case, since the PA is operated during signal transmission, the power supply SW 1114 is turned off so as to stop the operation of the two PAs during signal reception. Moreover, the setting of the constant current value I1 of the constant current source 1 115 is as follows. For a digital modulation type PA, the distortion is generally defined by the adjacent channel leak power. The adjacent channel leak power will be described briefly. As illustrated in FIG. 30, when a digital modulation operation is performed with a center frequency fc, the output wave will have a side lobe as indicated by the symbol "A" in FIG. 30(a), and the side lobe power increases in proportion to the distortion as illustrated in FIG. 30(b). In an adjacent channel whose frequency is displaced by +Äf, the side lobe power is an interfering wave. Therefore, the side lobe power is used as an index of digital modulation type distortion, and the suppression ratio of the +fw to −fw band width power integrated value centered about fc+Äf with respect to the +fw to −fw band width power integrated value centered about the center frequency fc is defined as an adjacent channel leak power Padj. The adjacent channel leak power Padj is normally a negative value, and increases (the absolute value thereof decreases) as the distortion increases. A digital modulation type PA has a lower distortion and requires a larger current consumption as the adjacent channel leak power Padj decreases (the absolute value thereof increases). Therefore, the constant current value I1 of the constant current source 1 115 is set to coincide with the current consumption value of one of the two PAs that has the smaller adjacent channel leak power Padj.

An LNA block of the present embodiment is made up of a total of two individual devices, i.e., the single circuit device 117 obtained by integrating together the LNA1 111, the LNA2 112 and the constant current source 1 115 on the same semiconductor substrate, and another device composed of the power supply SW 1114. The conventional LNA block illustrated in FIG. 33 requires a total of four devices, i.e., two devices respectively composed of the two power supply SWs 1114 and 1124, and other two devices respectively composed of the two LNAs 111 and 112. Therefore, as compared with the conventional example, the LNA block of the present embodiment provides a reduction in the number of components, thereby realizing a reduction in the size of a portable terminal.

Second Embodiment

Next, an LNA block according to the second embodiment of the present invention will be described. While two LNAs are used in the first embodiment, three LNAs are used in the present embodiment.

Figures 2A, 2B:
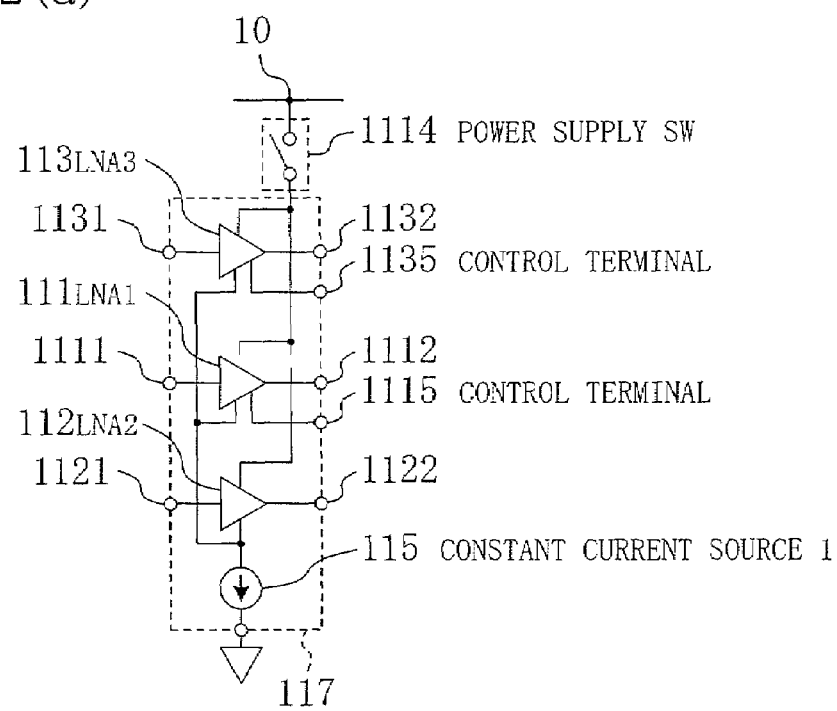
FIG. 2(a) is a diagram illustrating a configuration of an LNA block of a dual-band portable telephone according to the second embodiment of the present invention.
FIG. 2(b) is a diagram illustrating the operation of three LNAs based on the combination of potentials of two control terminals provided in the LNA block.

FIG. 2(a) illustrates an LNA block according to the present embodiment, wherein a third LNA3 113 is added to the LNA block of FIG. 1. A power supply terminal of the third LNA3 113 is connected to the power supply SW 1114, a ground terminal thereof is connected to the constant current source 1 115, and an input terminal 1131 and an output terminal 1132 thereof are provided independently. Moreover, as the first LNA1 111, the third LNA3 113 is provided with a control terminal 1135 for turning on/off the third LNA3 113.

In the present embodiment, assuming that the current flowing through the first LNA1 111 is I11, the current flowing through the second LNA2 112 is I12, and the current flowing through the third LNA3 113 is I13, the constant current source I1 is expressed as I1=I11+I12+I13. As illustrated in FIG. 2(b), the bias setting is such that I11=I1 and I13=0 hold when the control terminal 1115 of the first LNA1 111 is controlled to a high potential and the control terminal 1135 of the third LNA3 113 is controlled to a low potential. In this case, I12=0, whereby only the first LNA1 111 has a current flowing therethrough and is thus turned on. Similarly, the bias setting is such that I11=0 and I13=I1 hold when the control terminal 1115 of the first LNA1 111 is controlled to a low potential and the control terminal 1135 of the third LNA3 113 is controlled to a high potential. In this case, I12=0, whereby only the third LNA3 113 has a current flowing therethrough and is thus turned on. On the other hand, when the respective control terminals 1115 and 1135 of the first LNA1 111 and the third LNA3 113 are controlled to a low potential, I11=0 and I13=0 hold, whereby only the second LNA2 112 has a current flowing therethrough and is thus turned on.

Figure 33:
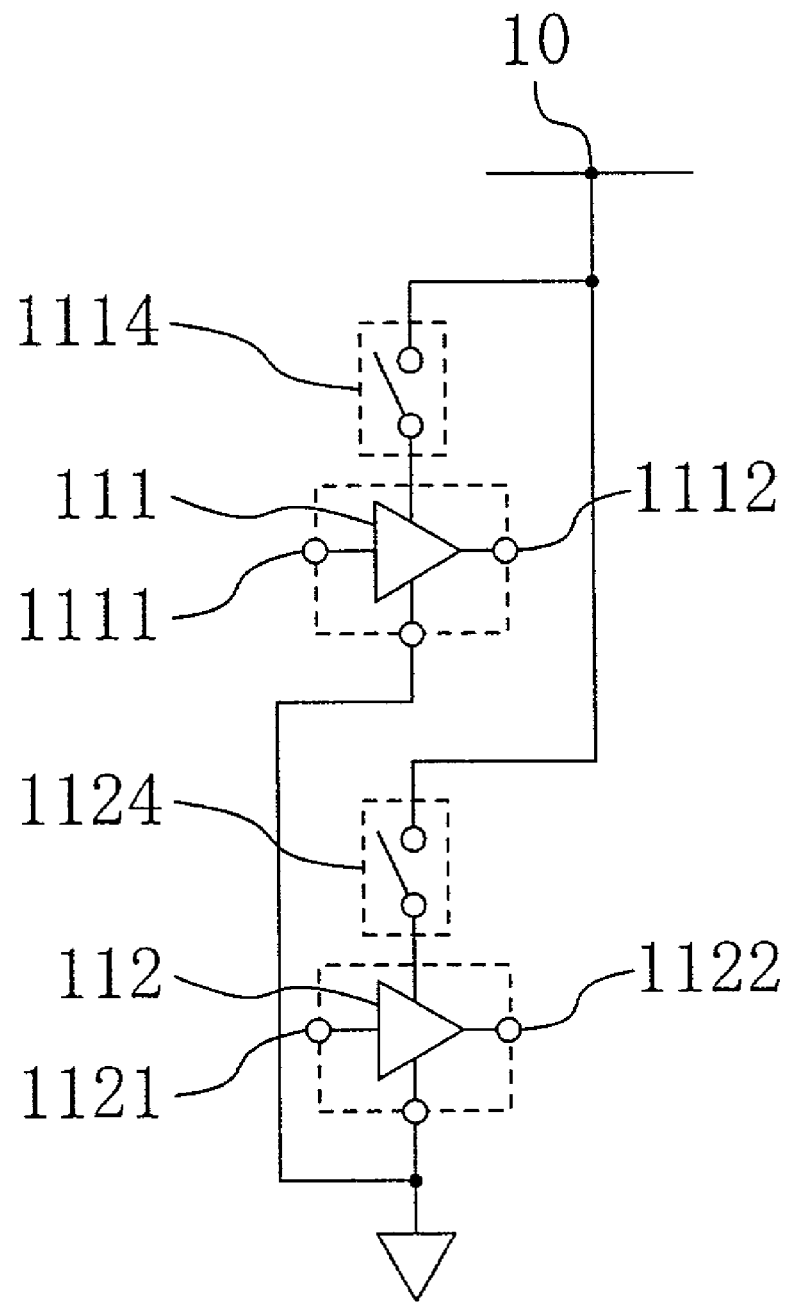
FIG. 33 is a diagram illustrating an example of an LNA block of a conventional dual-band portable telephone.

Therefore, the LNA block of the present embodiment, using three LNAs, also provides a reduction in the number of components, thereby realizing a reduction in the size of a portable terminal, as compared with the conventional example illustrated in FIG. 33.

Note that while it is desirable as in the first embodiment that the minimum current consumption values of the three LNAs are set to be equal to one another and equal to the constant current value I1 of the constant current source 1 115, when the third order intermodulation distortions thereof are different from one another, the constant current value I1 is set to coincide with the minimum current consumption value of one of the three LNAs that has the lowest distortion, i.e., the highest minimum current consumption value.

Moreover, while three LNAs are used in the present embodiment, the present invention can of course be applied similarly to cases where four or more LNAs are used.

Third Embodiment

Figure 3:
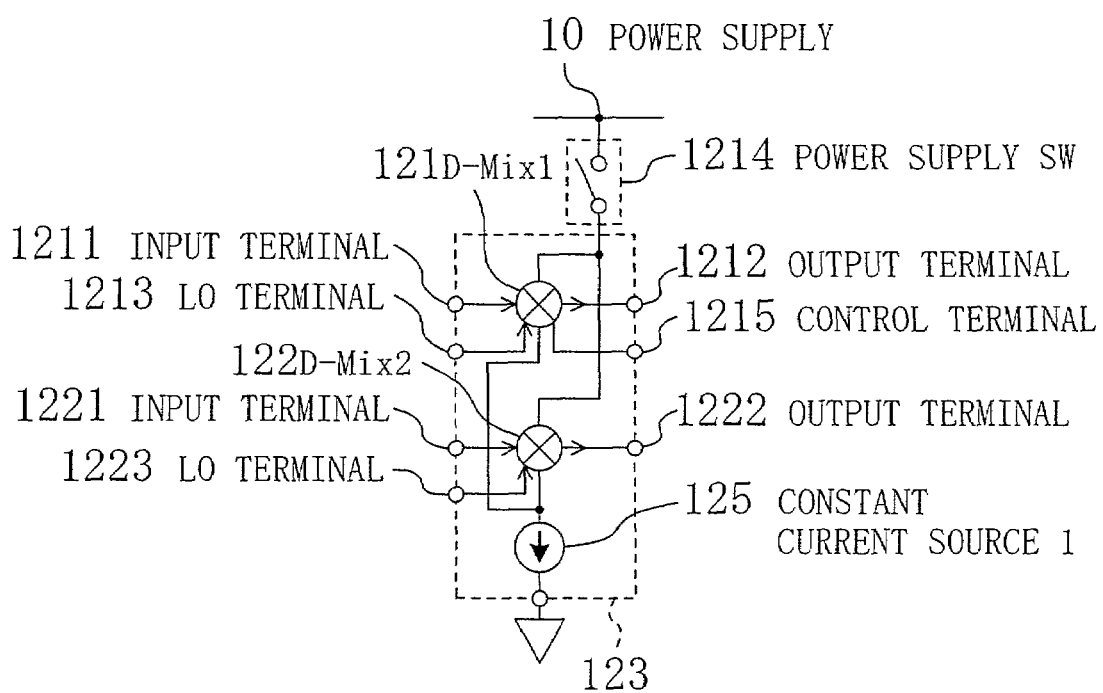
FIG. 3 is a diagram illustrating a configuration of a D-mix block of a dual-band portable telephone according to the third embodiment of the present invention.

FIG. 3 illustrates a configuration of a D-Mix block of a dual-band portable telephone according to the third embodiment of the present invention. In the present embodiment, two D-Mixes are used in place of two LNAs as in the first embodiment.

In FIG. 3, 121 denotes a first D-Mix1 (a semiconductor device and frequency conversion device), 122 denotes a second D-Mix2 (a semiconductor device and frequency conversion device), 125 denotes a constant current source 1, 10 denotes a power supply, and 1214 denotes a power supply SW. The first D-Mix1 121 has an input terminal 1211 through which a high frequency signal from an LNA (not shown) is input, an LO input terminal 1213 through which a signal of the frequency fLO1 from a local signal generator VCO (not shown) is input, and an output terminal 1212. Similarly, the second D-Mix2 122 has an input terminal 1221 through which a high frequency signal from another LNA (not shown) is input, an LO input terminal 1223 through which a signal of the frequency fLO2 from another local signal generator VCO (not shown) is input, and an output terminal 1222. The power supply terminals of the two D-Mixes, i.e., the D-Mix1 121 and the D-Mix2 122, are commonly connected, and the power supply SW 1214 is connected between the common terminal and the power supply 10. Moreover, the ground terminals of the D-Mix1 121 and the D-Mix2 122 are commonly connected, and the constant current source 1 125 is connected between the common terminal and the ground.

Furthermore, of the two D-Mixes, i.e., the D-Mix1 121 and the D-Mix2 122, the first D-Mix1 121 has a control terminal 1215 for turning on/off the first D-Mix1 121.

The switching between the two D-Mixes, i.e., the D-Mix1 121 and the D-Mix2 122, is performed by changing the voltage applied to the control terminal 1215 of the first D-Mix1 121 as in the first embodiment. The constant current value of the constant current source 1 125 is set to coincide with the minimum current consumption value of the D-Mix of the lower distortion as in the first embodiment.

The two D-Mixes, i.e., the D-Mix1 121 and the D-Mix2 122, and the constant current source 1 125 are integrated on the same semiconductor substrate to form a single circuit device 123, and the circuit device 123 is sealed in a single package.

The operation of the D-Mix block of the present embodiment is similar to that of the LNA block of the first embodiment, and thus will not be described below.

Therefore, the D-Mix block of the present embodiment is also made up of a total of two devices, i.e., the single circuit device 123 and another device composed of the power supply SW 1214. Thus, it is possible to reduce the number of components, thereby realizing a reduction in the size of a portable terminal, as compared with the conventional example illustrated in FIG. 33.

Note that while two D-Mixes are used in the present embodiment, a case where three or more D-Mixes are used is as described above in the second embodiment, and thus will not be described below.

Fourth Embodiment

Figure 4:
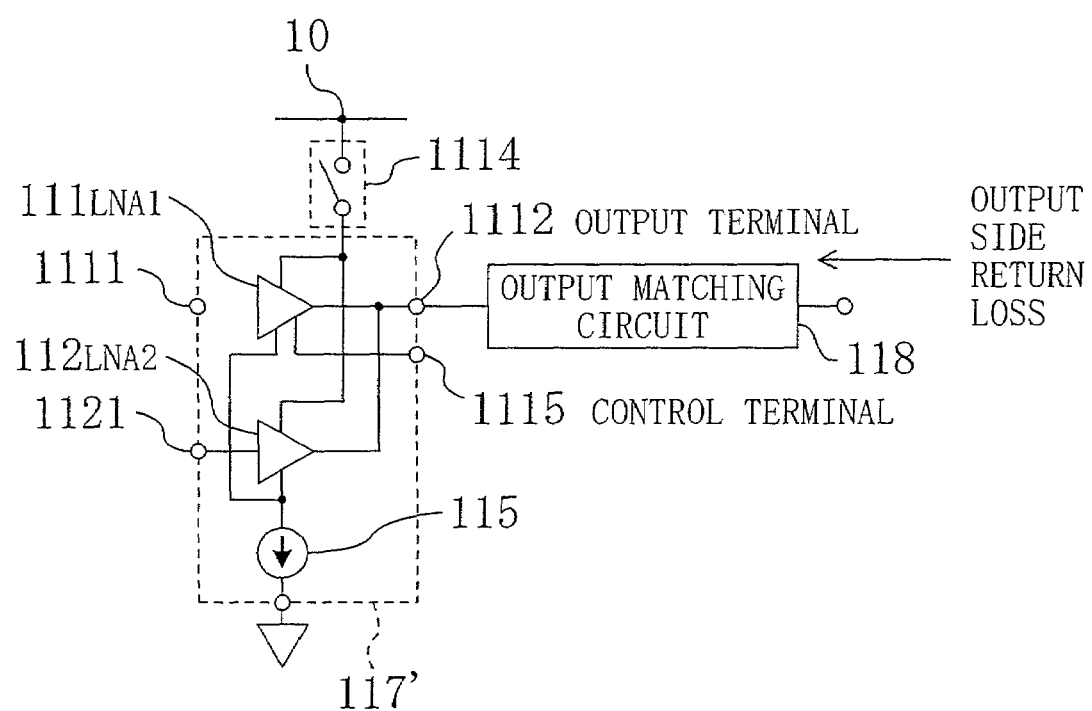
FIG. 4 is a diagram illustrating a configuration of an LNA block of a dual-band portable telephone according to the fourth embodiment of the present invention.

FIG. 4 illustrates a configuration of an LNA block of a dual-band portable telephone according to the fourth embodiment of the present invention. In the following description, only the differences between the present embodiment and the first embodiment will be described, and those components already described above are provided with the same reference numerals and will not be described below.

Specifically, the output terminal of the second LNA2 112 is connected to the output terminal 1112 of the first LNA1 111, whereby an output terminal is shared by the first LNA1 111 and the second LNA2 112. Therefore, a circuit device 117' provides the effect of reducing the number of terminals by one from that of the circuit device 117 of the first embodiment.

Figure 31:
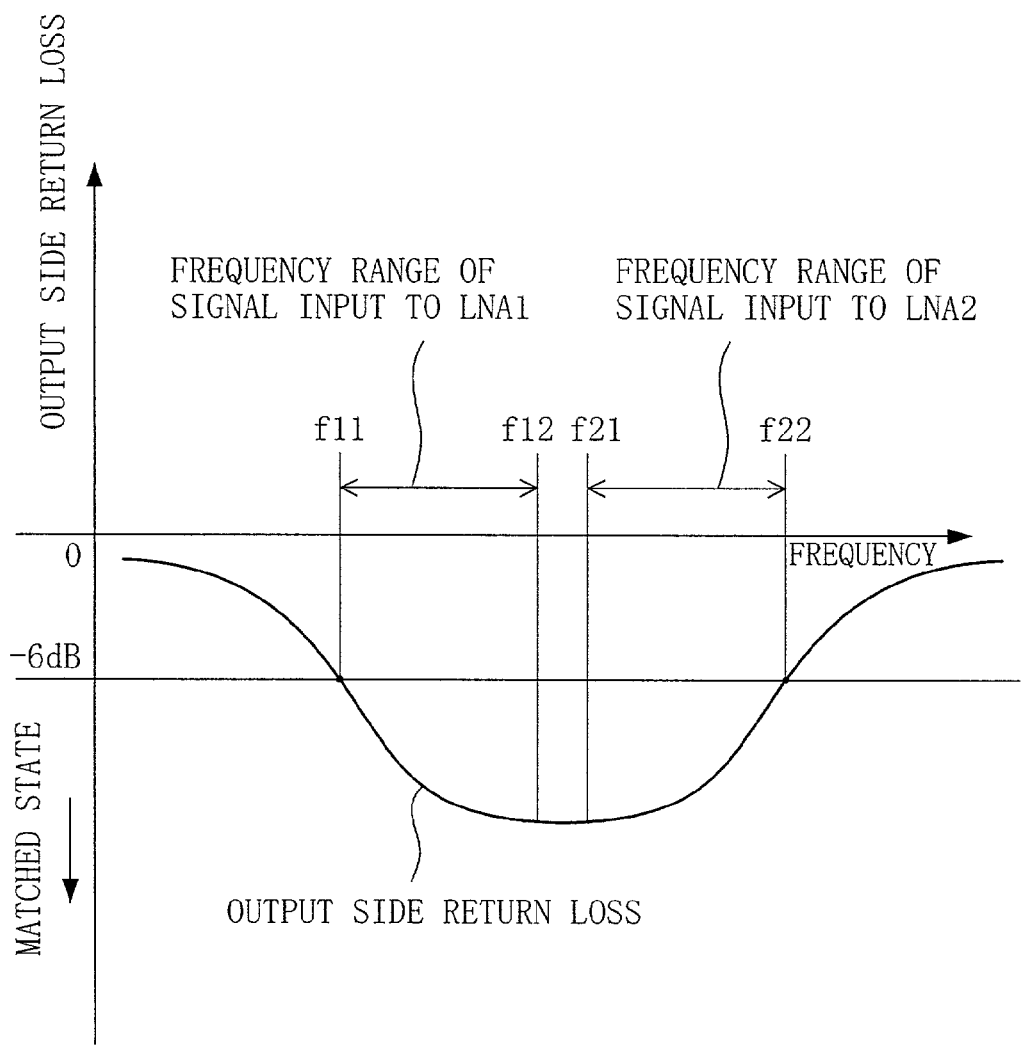
FIG. 31 is a diagram illustrating frequency vs. output side return loss characteristics, illustrating conditions under which an output terminal can be shared by two low noise amplifiers provided in an LNA block.
Figure 32:
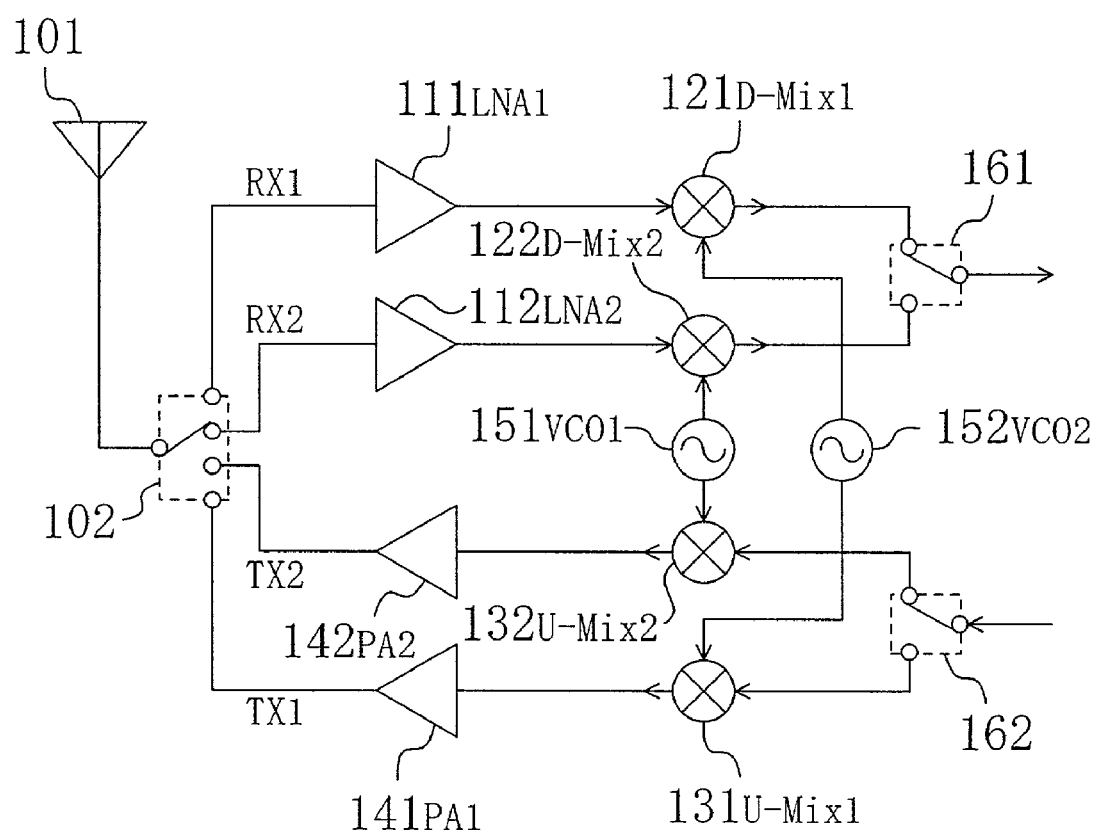
FIG. 32 is a diagram illustrating an example of a high frequency block of a conventional dual-band portable telephone.

The conditions under which an output terminal can be shared by two LNAs will now be described. In a dual-band portable telephone, the frequency ranges of signals that are respectively input to two LNAs differ from each other. However, if the frequency ranges of the signals are close to each other, an output matching circuit 118 can be shared by the two LNAS, as illustrated in FIG. 4. Little reflection of power on the output terminal side of the output matching circuit 118 represents a desirably matched state, and in the desirably matched state, the return loss on the output terminal side of the output matching circuit 118 is small, i.e., less than or equal to the setting value, typically less than or equal to −6 dB, as illustrated in FIG. 31. Therefore, the case where the frequency ranges of two signals are close to each other refers to a case where, with the frequency range of the signal that is input to one LNA (e.g., the first LNA1 111) being f11–f12 and with the frequency range of the signal input that is input to the other LNA (the second LNA2 112) being f21–f22, the return loss on the output terminal side of the output matching circuit 118 is less than or equal to the setting value (e.g., −6 dB) in both of the frequency ranges.

Figure 5:
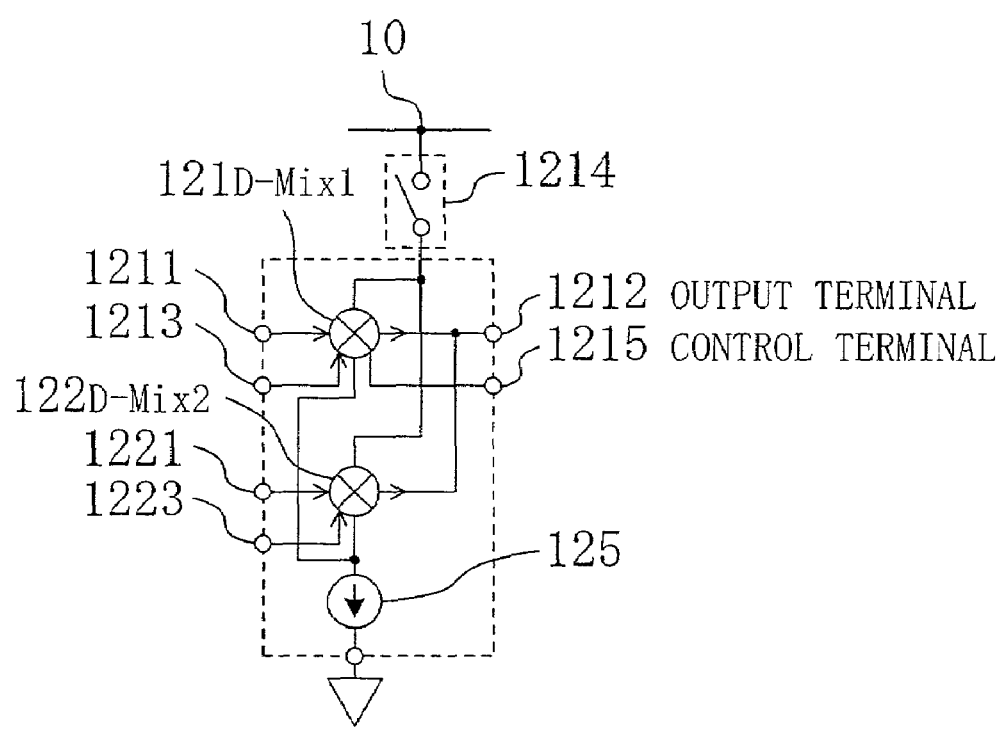
FIG. 5 is a diagram illustrating a variation of the embodiment.

FIG. 5 illustrates a variation of the present embodiment. In the fourth embodiment, an output terminal is shared by the two LNAs 111 and 112, which are provided in the LNA block of the dual-band portable telephone. In the variation, an output terminal is shared by the two D-Mixes 121 and 122 provided in the D-Mix block of the dual-band portable telephone of the third embodiment. Specifically, in FIG. 5, the output side of the second D-Mix2 122 is connected to the output terminal 1212 of the first D-Mix1 121, and the output terminal of the second D-Mix 122 is omitted. The other parts, the conditions under which an output terminal can be shared, etc., are as described above in the fourth embodiment, and thus will not be described below.

Fifth Embodiment

Figure 6A:
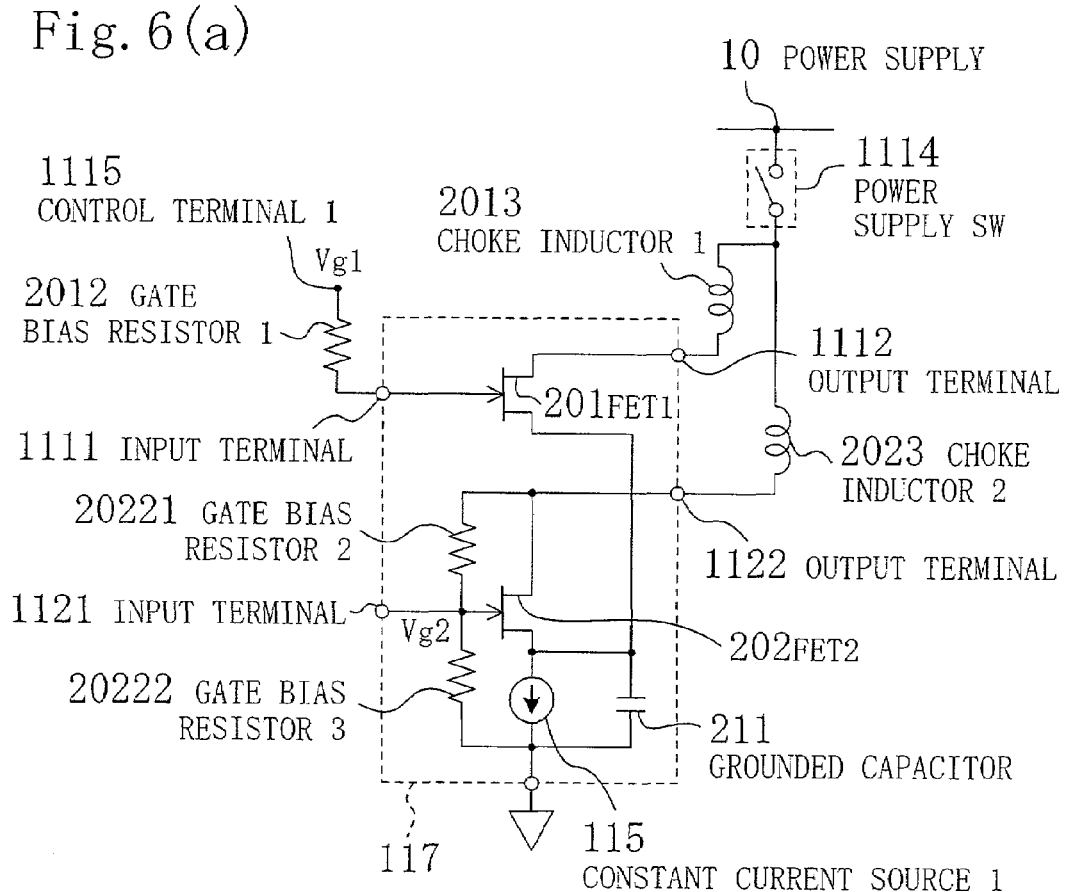
FIG. 6(a) is a diagram illustrating a configuration of an LNA block of a dual-band portable telephone according to the fifth embodiment of the present invention.

FIG. 6(a) illustrates a configuration of an LNA block of a dual-band portable telephone according to the fifth embodiment of the present invention. The present embodiment is a specific implementation of the configuration of FIG. 1, which illustrates the first embodiment. Specifically, in the present embodiment, as an LNA, a field effect transistor (hereinafter referred to as "FET") is used as a source-grounded circuit, and a grounded capacitor is further provided.

In FIG. 6(a), 201 denotes an FET1 of the first LNA, 202 denotes an FET2 of the second LNA, and 1114 denotes a power supply SW. Moreover, 2012 denotes a gate bias resistor 1, 20221 denotes a gate bias resistor 2, 20222 denotes a gate bias resistor 3, 2013 denotes a choke inductor 1, 2023 denotes a choke inductor 2, and 211 denotes a grounded capacitor. It is assumed that the FET1 201 and the FET2 202 have an equal threshold value (hereinafter referred to as "Vth"). This also applies to the subsequent embodiments.

The drains of the two FETs, i.e., the FET1 201 and the FET2 202, serve as the output terminals 1112 and 1122 and are connected to the choke inductor 1 2013 and the choke inductor 2 2023, respectively, the other ends of the choke inductors are commonly connected, the power supply SW 1114 is connected to the common terminal, and the other end of the power supply SW 1114 is connected to the power supply 10. Moreover, the sources of the FET1 201 and the FET2 202 are commonly connected, the constant current source 1 115 and the grounded capacitor 211 are connected in parallel to the common terminal, and the other ends thereof are connected to the ground. Moreover, the input terminal 1111 of the first FET1 201 is connected to the control terminal 1115 via the gate bias resistor 1 2012. On the other hand, the input terminal 1121 of the second FET2 202 is connected to the drain of the second FET2 202 and the ground via the gate bias resistor 2 20221 and the gate bias resistor 3 20222, respectively. The power supply SW 1114 is turned off during signal transmission so as to turn off both of the FETs 201 and 202.

The grounded capacitor 211 is provided to ground the source terminals of the two FETs 201 and 202 for high frequencies while opening them for direct currents so as to improve the high frequency characteristics. Therefore, the impedance of the grounded capacitor 211 is selected to be a sufficiently small value for the constant current source 1 115 in a frequency to be used. Specifically, with the frequency being f (Hz), the impedance Rc of the grounded capacitor 211 is expressed as Rc=1/(2×π×f×c), and if R>>Rc (typically, R>10×Rc) with the impedance of the constant current source 1 115 being R, a substantial portion of the current of the frequency component f flows through the grounded capacitor 211, whereby the voltage between the opposite ends of the grounded capacitor 211 for the frequency component f is substantially "0" (v). In order for the expression R>>Rc to be satisfied for each of the frequencies of the two input signals, the impedance Rc of the grounded capacitor 211 is set so as to correspond to the lower one of the frequency ranges of the two signals.

Moreover, the two choke inductors, i.e., the choke inductor 1 2013 and the choke inductor 2 2023, are provided to supply DC power supplies to the FET1 201 and the FET2 202, respectively, and to open the impedance of the drain for high frequencies in a frequency to be used. Therefore, the impedance of each of the choke inductor 1 2013 and the choke inductor 2 2023 is selected to be sufficiently large for the load impedance in a frequency to be used.

Furthermore, the gate bias resistor 1 2012 is provided to keep the control terminal 1115 and the input terminal 1111 of the first FET 201 at the same potential for direct currents and to isolate the terminals from each other for high frequencies.

Figure 6B:
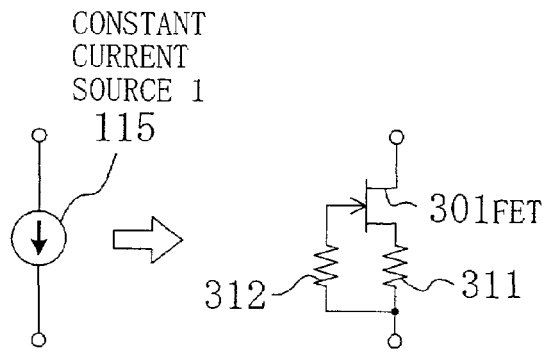
FIG. 6(b) is a diagram illustrating a specific example of a constant current source.

The constant current source 1 115 is provided by using an FET 301 and two resistors 311 and 312 as illustrated in FIG. 6(b), for example. Specifically, one end of the resistor 311 is connected to the source of the FET 301 and the other end of the resistor 311 is connected to the gate of the FET 301 via the resistor 312.

Note that while the impedance of an evaluation system is typically 50 Ω or 75 Ω, the input/output impedance of the FETs 201 and 202 normally takes a value other than these values. Therefore, in order to efficiently transmit a power to the FETs 201 and 202, there is actually required a matching circuit on the input/output side of each FET. However, the input/output matching circuits are omitted in FIG. 6(a).

The circuit device 117 is obtained by integrating together the FET 201, the FET 202, the gate bias resistor 2 20221, the gate bias resistor 3 20222, the grounded capacitor 211 and the constant current source 1 115 on the same semiconductor substrate.

Next, the operation of the circuit of FIG. 6(a) will be described. Now, it is assumed that the current value of the constant current source 1 115 during signal reception is I1. In FIG. 6(a), it is assumed that the gate of the second FET2 202 is set to a voltage Vg2 by the two gate bias resistors 20221 and 20222. In a case where Vg1<Vg2, wherein Vg1 is the voltage of the control terminal 1 1115, with the voltage Vg1 being set to a low potential (e.g., "0" V), the constant current I1 flows through the second FET2 202 and the current of the first FET1 201 is "0". Therefore, the second FET2 202 is turned on, and the first FET1 201 is turned off. On the other hand, in a case where the voltage Vg1 is set to a high potential, whereby Vg1>Vg2, the constant current I1 flows through the first FET1 201 and the current of the second FET2 202 is "0". Therefore, the first FET1 201 is turned on, and the second FET2 202 is turned off.

Therefore, the present embodiment provides an effect that in a case where an LNA is provided by using an FET and a source-grounded circuit is provided, the source terminal of the FET can be grounded for high frequencies and opened for direct currents by the grounded capacitor 211, thereby improving the high frequency characteristics, in addition to providing the effect that an LNA block can be provided by using a total of two devices, thereby reducing the number of components and realizing a reduction in the size of a portable terminal, as in the first embodiment.

Figure 7:
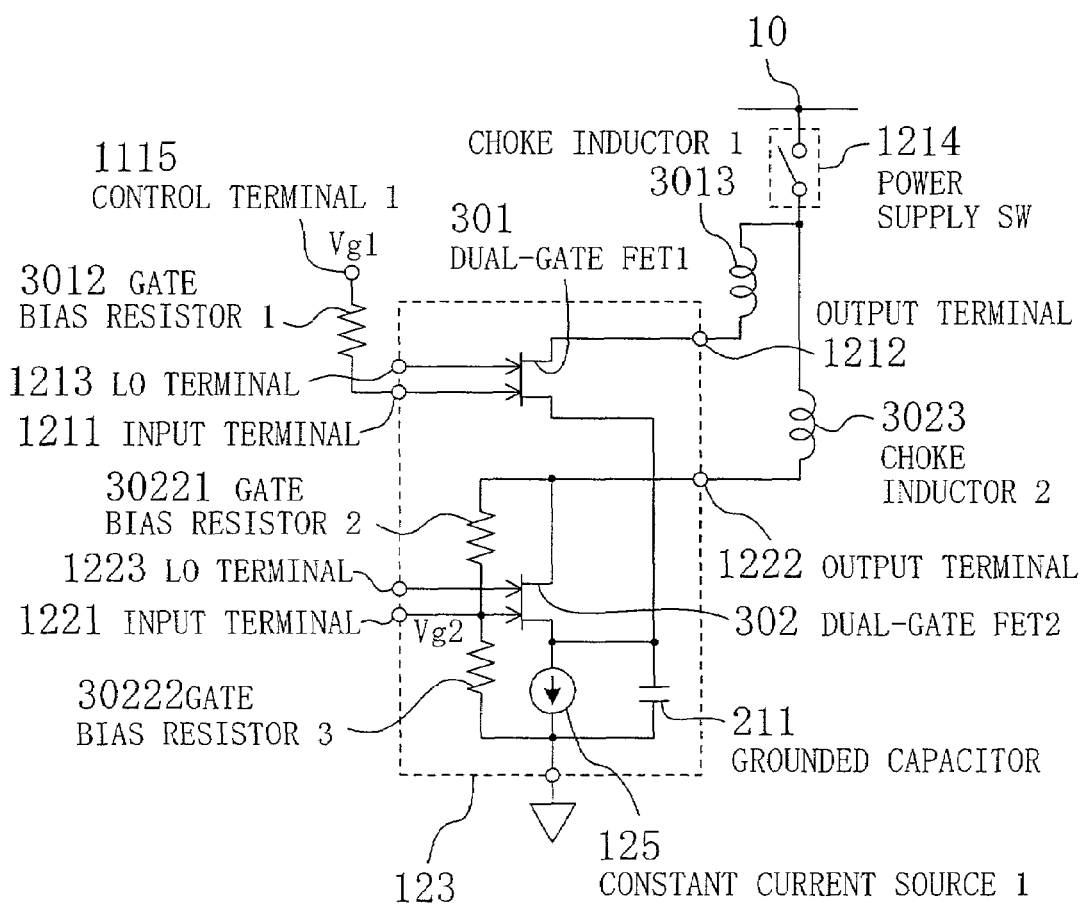
FIG. 7 is a diagram illustrating a first variation of the embodiment.

FIG. 7 illustrates a first variation of the present embodiment. The variation shows a configuration similar to that of the D-Mix block of the dual-band portable telephone of the third embodiment (see FIG. 3) except that the two D-mixes are provided by using a first dual-gate FET1 301 and a second dual-gate FET2 302 while the grounded capacitor 211 is arranged in parallel to the constant current source 1 125. Specifically, in FIG. 7, 301 denotes a dual-gate FET1, 302 denotes a dual-gate FET2, 3012 denotes a gate bias resistor 1, 30221 denotes gate bias resistor 2, 30222 denotes gate bias resistor 3, 3013 denotes a choke inductor 1, and 3023 denotes a choke inductor 2. It is assumed that the dual-gate FET1 301 and the dual-gate FET2 302 have an equal threshold voltage Vth. This also applies to the subsequent embodiments.

The drains of the dual-gate FET1 301 and the dual-gate FET2 302 are connected to the choke inductor 1 3013 and the choke inductor 2 3023, respectively, the other ends of the choke inductors are commonly connected, the power supply SW 1214 is connected to the common terminal, and the other end of the power supply SW 1214 is connected to the power supply 10. Moreover, the sources of the dual-gate FET1 301 and the dual-gate FET2 302 are commonly connected, the constant current source 1 125 is connected to the common terminal, and the other end of the constant current source 1 125 is connected to the ground. Furthermore, the grounded capacitor 211 is connected in parallel to the constant current source 1 125. In the dual-gate FETs 301 and 302, the input terminal 1211, the input terminal 1221, the output terminal 1212, the output terminal 1222, the LO input terminal 1213 and the LO input terminal 1223 are all independent. The switching between the two D-Mixes is performed by changing the voltage applied to the control terminal 1 1115, which is connected to the input terminal 1211 of the dual-gate FET1 301 via the gate bias resistor 1 3012. Note that the constant current source 1 125 is provided by using the same circuit as that shown in FIG. 6(b).

The circuit device 123 is obtained by integrating together the dual-gate FET1 301, the dual-gate FET2 302, the gate bias resistor 2 30221, the gate bias resistor 3 30222, the grounded capacitor 211 and the constant current source 1 125 on the same semiconductor substrate.

Figure 8:
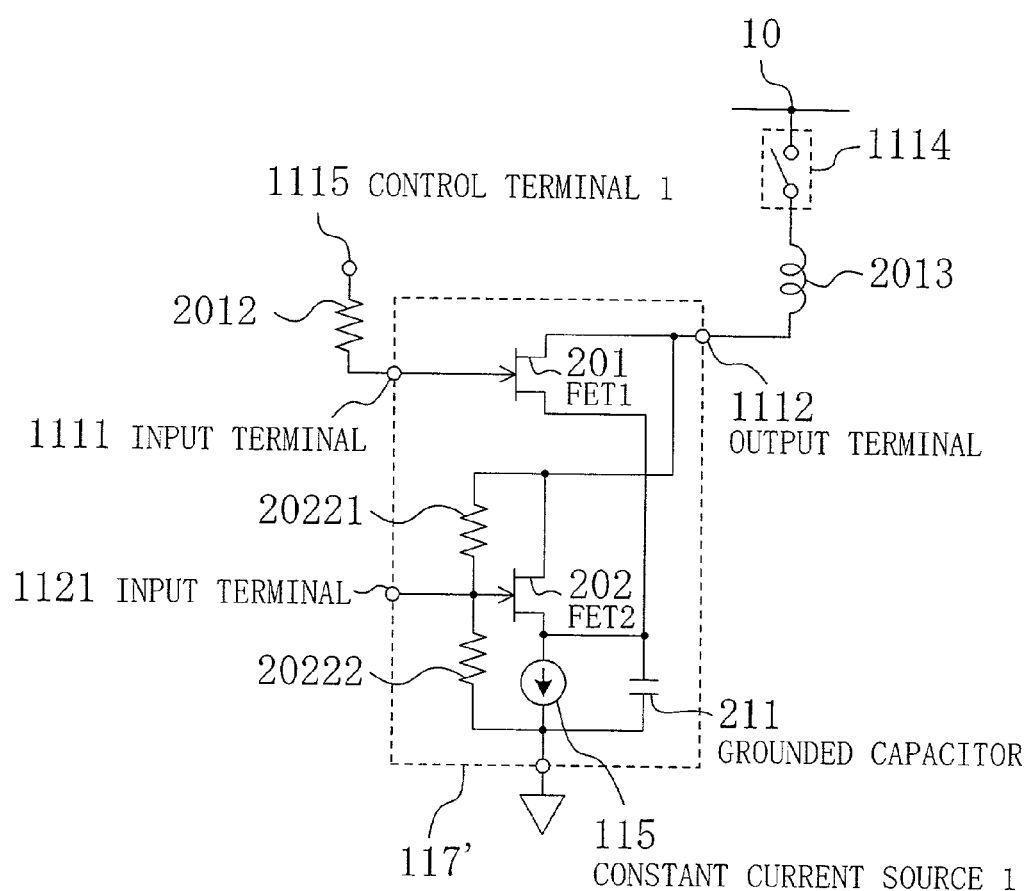
FIG. 8 is a diagram illustrating a second variation of the embodiment.
Figure 9:
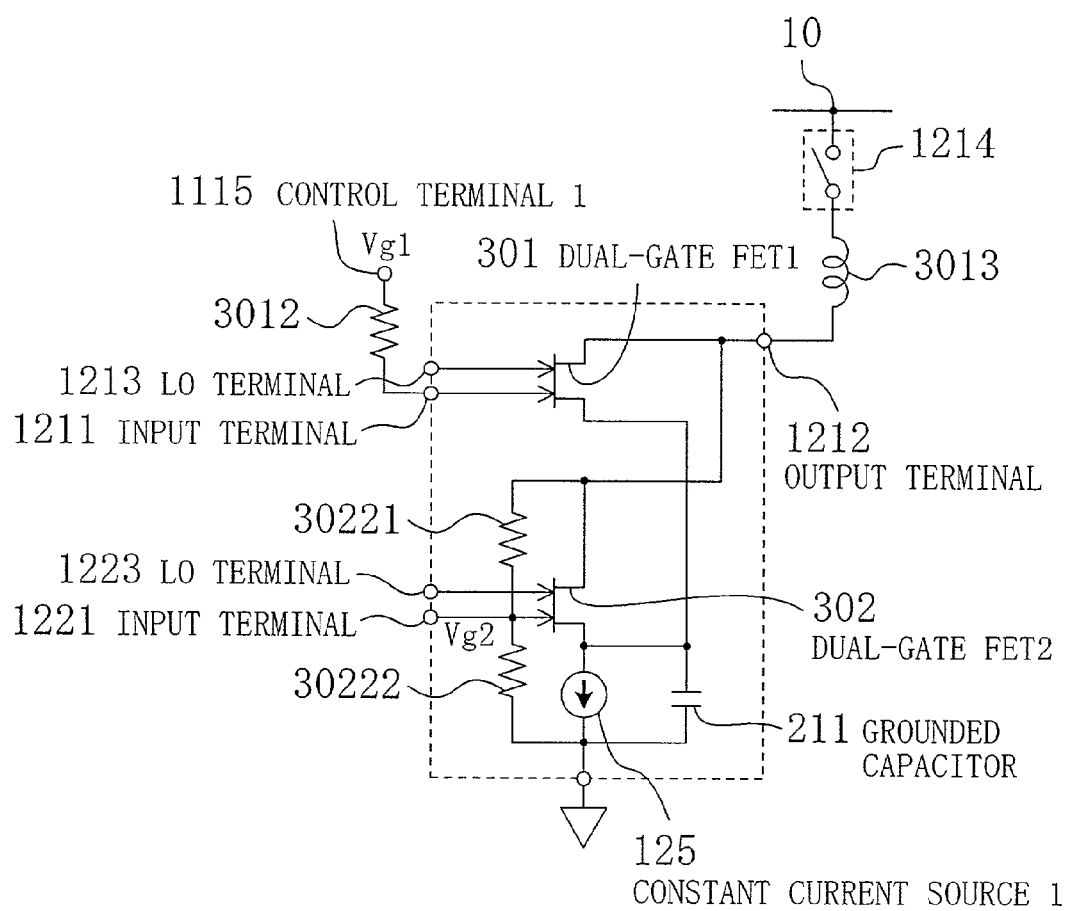
FIG. 9 is a diagram illustrating a third variation of the embodiment.

Moreover, FIG. 8 and FIG. 9 respectively illustrate a second variation and a third variation of the present embodiment. The second variation shows a configuration similar to that of the LNA block of the dual-band portable telephone of the fourth embodiment (see FIG. 4) except that the two LNAs are provided by using the first dual-gate FET1 201 and the second dual-gate FET2 202 while the grounded capacitor 211 is arranged in parallel to the constant current source 1 125. Furthermore, the third variation shows a configuration similar to that of the D-Mix block of the dual-band portable telephone of the variation of the fourth embodiment (see FIG. 5) except that the two D-Mixes sharing an output terminal are provided by using the first dual-gate FET1 301 and the second dual-gate FET2 302 while the grounded capacitor 211 is arranged in parallel to the constant current source 1 125.

The second and third variations as described above provide the effect that the source terminal of an FET is grounded for high frequencies and opened for direct currents by the grounded capacitor 211, thereby improving the high frequency characteristics, as in the present embodiment.

Sixth Embodiment

Figure 10:
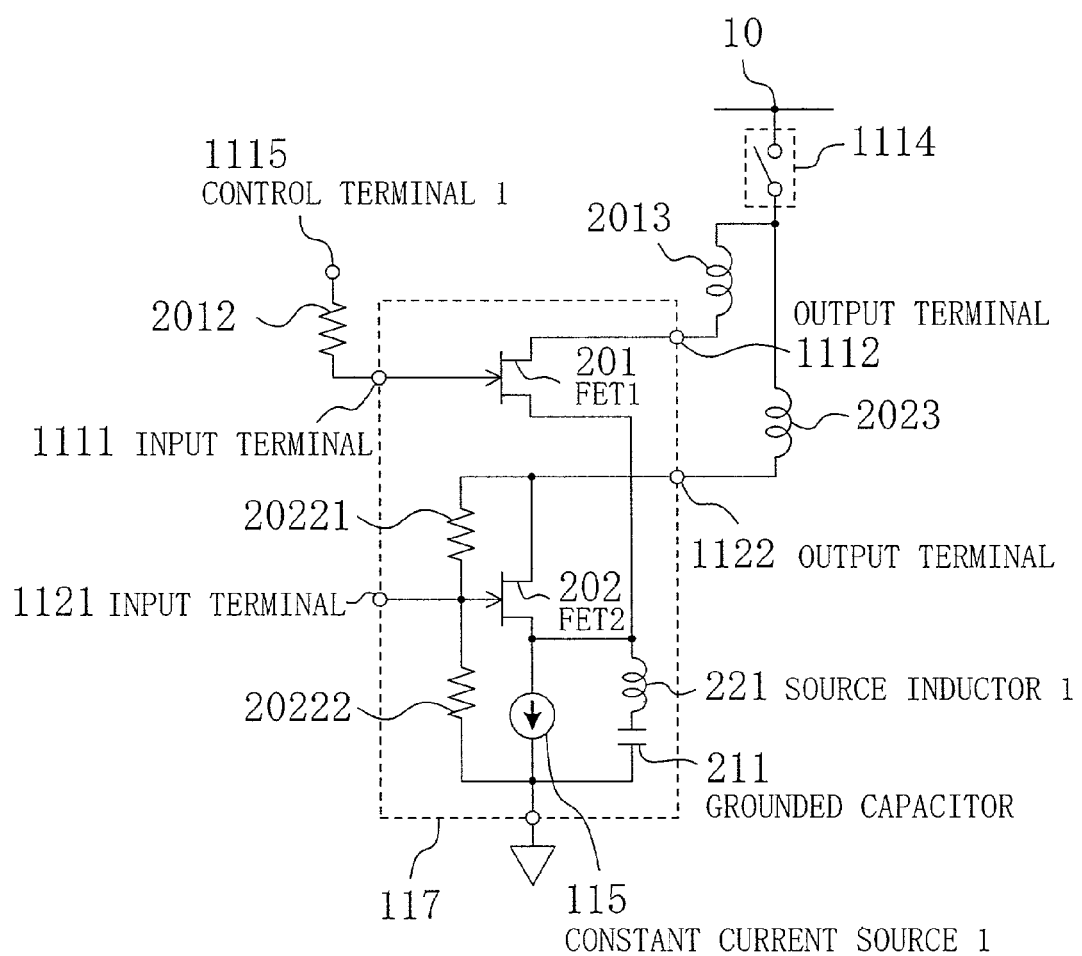
FIG. 10 is a diagram illustrating a configuration of an LNA block of a dual-band portable telephone according to the sixth embodiment of the present invention.

FIG. 10 illustrates a configuration of an LNA block according to the sixth embodiment of the present invention. The present embodiment is an improvement to the configuration of FIG. 6(a), which illustrates the fifth embodiment. Specifically, in the LNA block of FIG. 10, which illustrates the present embodiment, an inductor between the source of the FETs and the ground is further added to the configuration of FIG. 6(a).

Specifically, in FIG. 10, an inductor (hereinafter referred to as a "source inductor") 221 is connected in series with the grounded capacitor 211, and the series circuit of the grounded capacitor 211 and the source inductor 221 is connected in parallel to the constant current source 1 115.

In the present embodiment, the source inductor 221 is inserted between the source of the first FET1 201 and the second FET2 202 and the ground, whereby the stability factor of the FETs 201 and 202 is improved, while the impedance "Gain max" at which the input return loss of the FETs 201 and 202 is minimized and the impedance "Āopt" at which the noise figure is minimized come close to each other, thereby obtaining a good level of matching and a desirable noise figure. Note, however, the gain of the FETs 201 and 202 decreases as the value of the source inductor 221 increases. Since the gain of an FET increases as the frequency of an input signal increases, the value of the source inductor 221 is determined in the present embodiment so as to ensure that the gain of the FET whose input signal has the higher frequency is at an appropriate value.

Therefore, in the present embodiment, the provision of the source inductor 221 makes it possible to improve the stability factor of the two FETs 201 and 202 from that in the fifth embodiment while ensuring a desirable gain of the first and second FETs 201 and 202, thereby achieving both a low noise figure and a desirable input return loss in the FETs 201 and 202.

Figure 11:
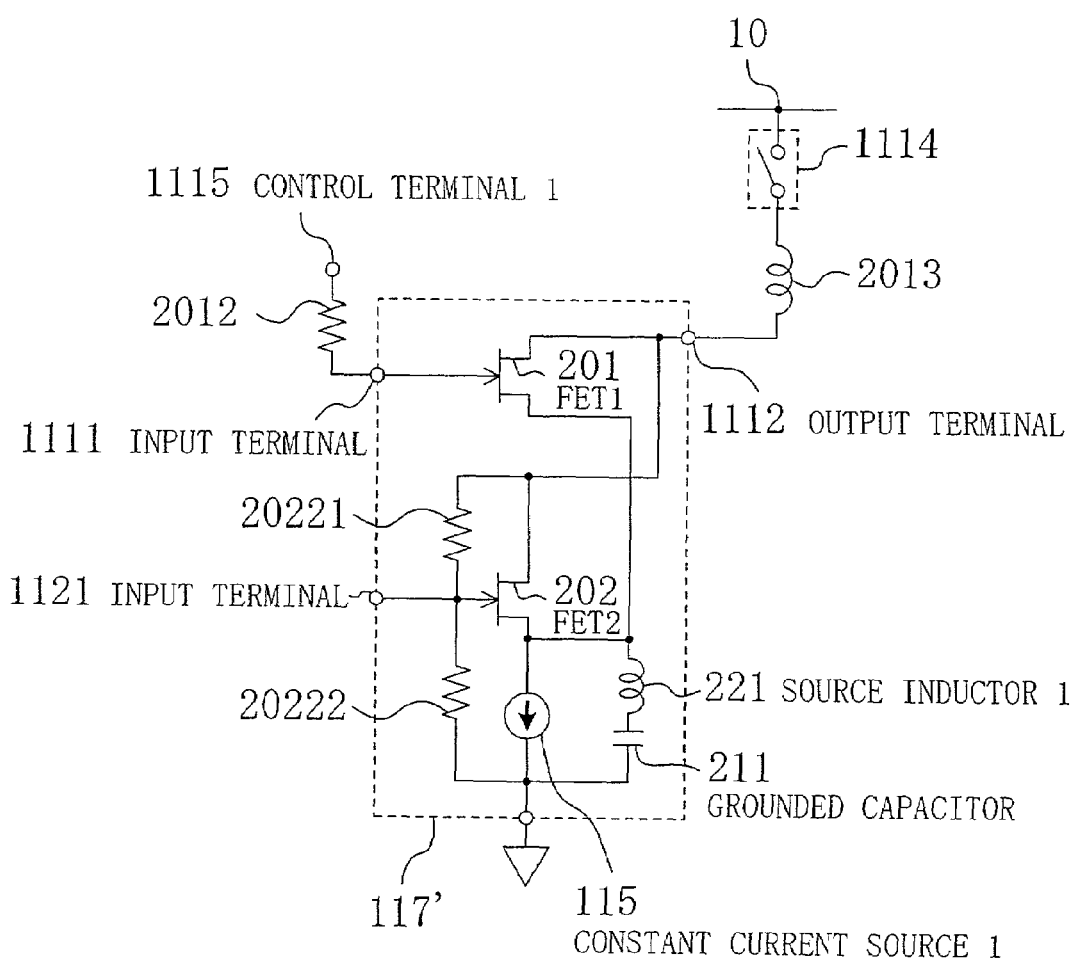
FIG. 11 is a diagram illustrating a first variation of the embodiment.
Figure 12:
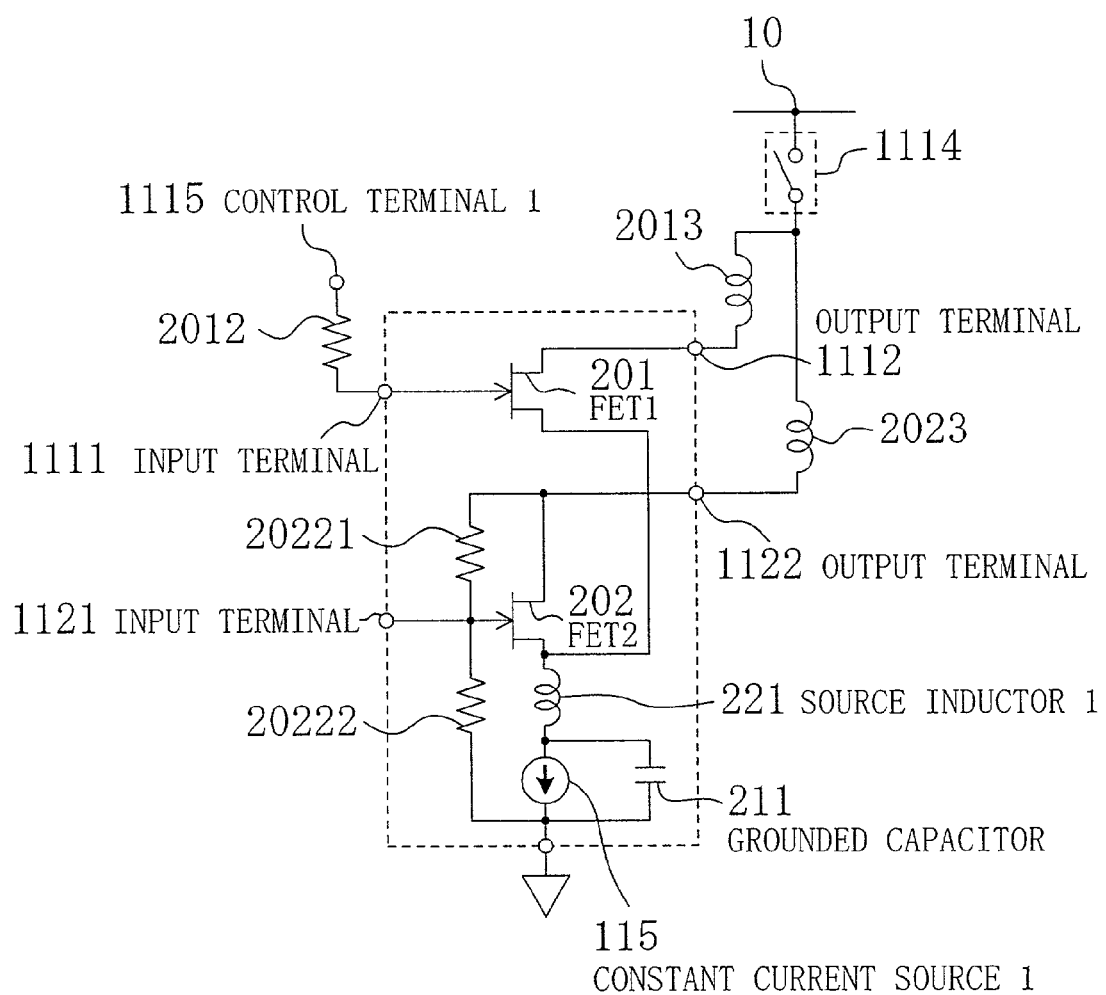
FIG. 12 is a diagram illustrating a second variation of the embodiment.
Figure 13:
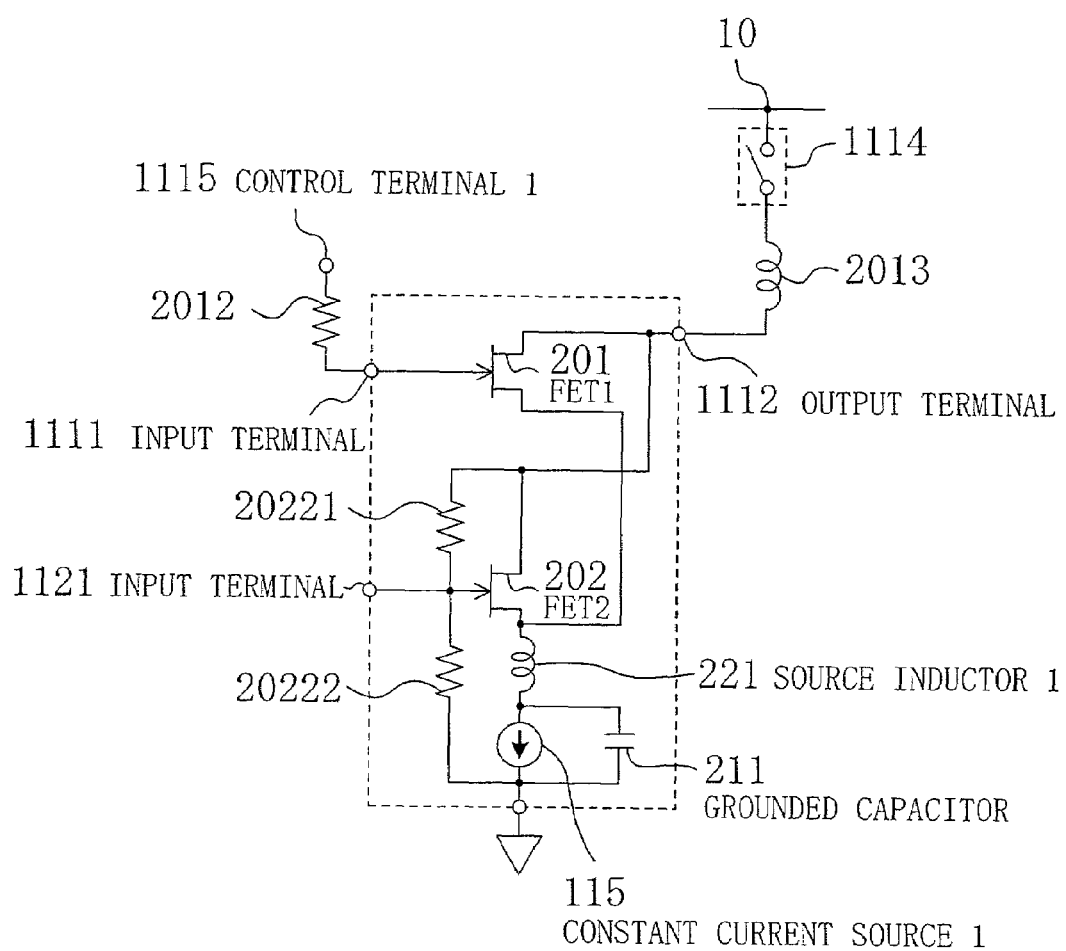
FIG. 13 is a diagram illustrating a third variation of the embodiment.

FIG. 11 illustrates a first variation of the present embodiment. The variation is similar to the LNA block of the second variation of the fifth embodiment (see FIG. 8) except that the source inductor 1 221 is connected in series with the grounded capacitor 211 while the series circuit is connected in parallel to the constant current source 1 115. Moreover, FIG. 12 and FIG. 13 illustrate a second variation and a third variation of the present embodiment, respectively. The second variation is similar to the LNA block of the present embodiment illustrated in FIG. 10 except that the position of the source inductor 1 221 is changed to a position between the source of the second FET2 202 and the constant current source 1 115, with only the grounded capacitor 211 being connected in parallel to the constant current source 1 115. Moreover, the third variation is similar to the LNA block of the first variation of the present embodiment (FIG. 11) except that the position of the source inductor 1 221 is changed as in the second variation. The second and third variations provide effects as those of the present embodiment.

Note that while a case where a source inductor is provided for an LNA block is illustrated in the second and third variations of the present embodiment, it is of course possible to similarly provide a source inductor for a D-mix block, etc.

Seventh Embodiment

Figure 14:
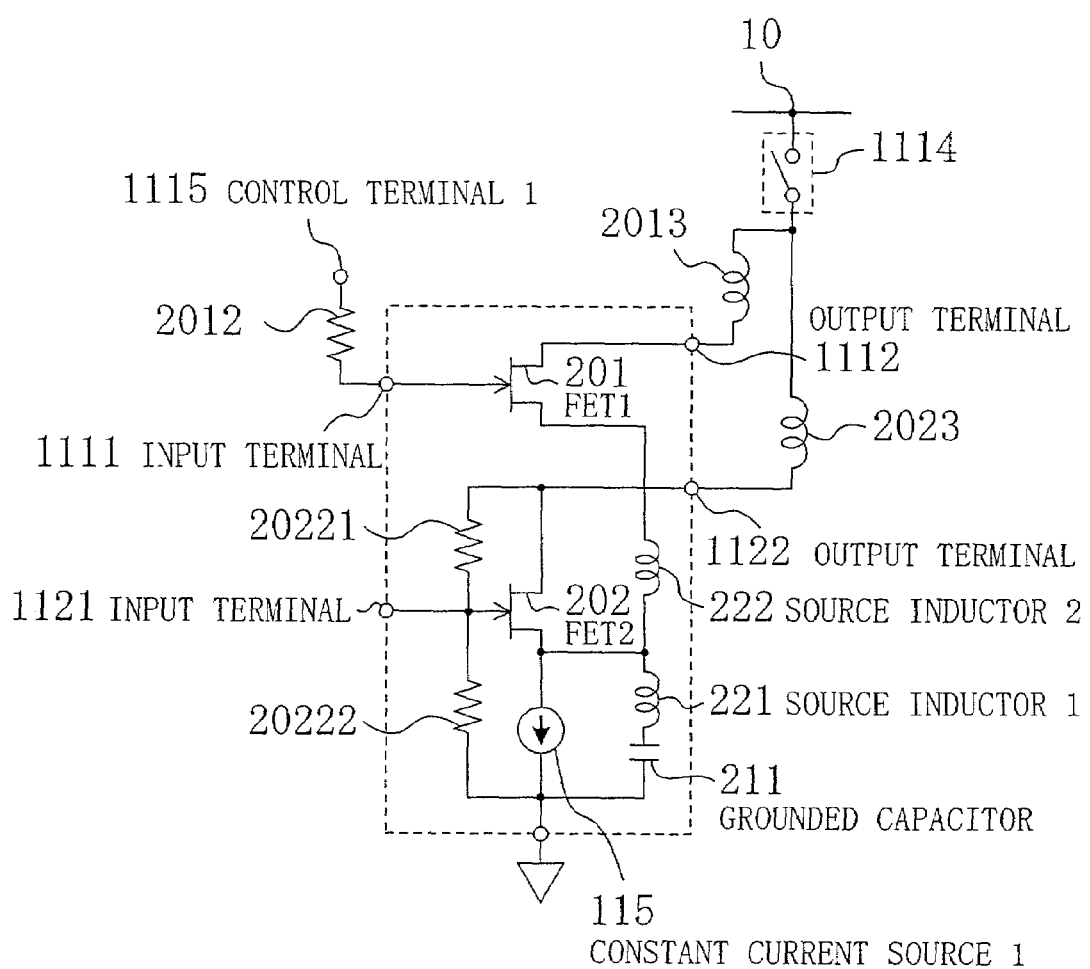
FIG. 14 is a diagram illustrating a configuration of an LNA block of a dual-band portable telephone according to the seventh embodiment of the present invention.

FIG. 14 illustrates a configuration of an LNA block according to the seventh embodiment of the present invention. In the present embodiment, the source inductor 221 of the sixth embodiment is provided separately for each of two FETS.

In the present embodiment, it is assumed that the relationship fRX1<fRX2 holds between the frequency fRX1 of a signal that is input to the first FET1 201 and the frequency fRX2 of a signal that is input to the second FET2 202. In FIG. 14, one end of a source inductor 2 222 is connected to the source of the first FET1 201, and the other end thereof is connected to the source of the second FET2 202. The series circuit of the other source inductor 1 221 and the grounded capacitor 211 and the constant current source 1 115 are connected in parallel to the source of the second FET2 202.

Therefore, in the present embodiment, the sum of the values of the two source inductors 221 and 222 is the source inductor value for the first FET1 201, and the value of the source inductor 1 221 is the source inductor value for the second FET2 202. Thus, the source inductor value is set to be large for the first FET1 201 to which a signal having the low frequency fRX1 is input, and the source inductor value is set to be small for the second FET2 202 to which a signal having the high frequency fRX2 is input. Since the gain of an FET increases as the frequency of the input signal decreases as already described above in the sixth embodiment, the configuration described above makes it possible to have different source inductor values for the FETs 201 and 202 while having the gains of the two FETs 201 and 202 at substantially the same value, thereby realizing a low noise figure and a desirable input return loss for each of the FETs 201 and 202.

Note that while it is assumed that the respective frequencies of the signals input to the first and second FETs 201 and 202 have the relationship fRX1<fRX2 in the present embodiment, it is needless to say that when the relationship is conversely fRX1>fRX2, the position of the source inductor 2 221 can be changed to a position between the source of the second FET2 202 and the constant current source 1 115.

Figure 15:
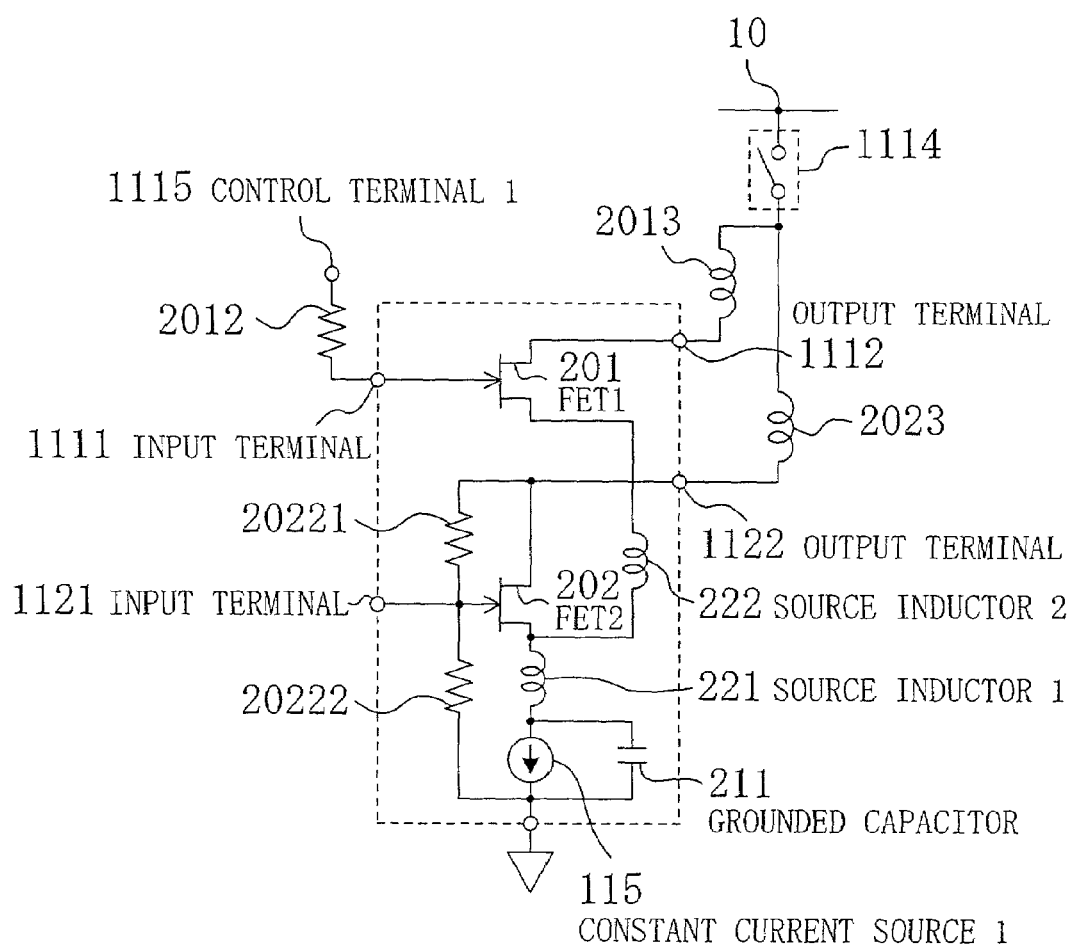
FIG. 15 is a diagram illustrating a variation of the embodiment.

FIG. 15 illustrates a variation of the present embodiment. In the variation, the position of the first source inductor 1 221 of the present embodiment is changed to a position between the source of the second FET2 202 and the constant current source 1 115, with only the grounded capacitor 221 being arranged in parallel to the constant current source 1 115. The variation provides effects as those of the present embodiment.

Eighth Embodiment

Figure 16:
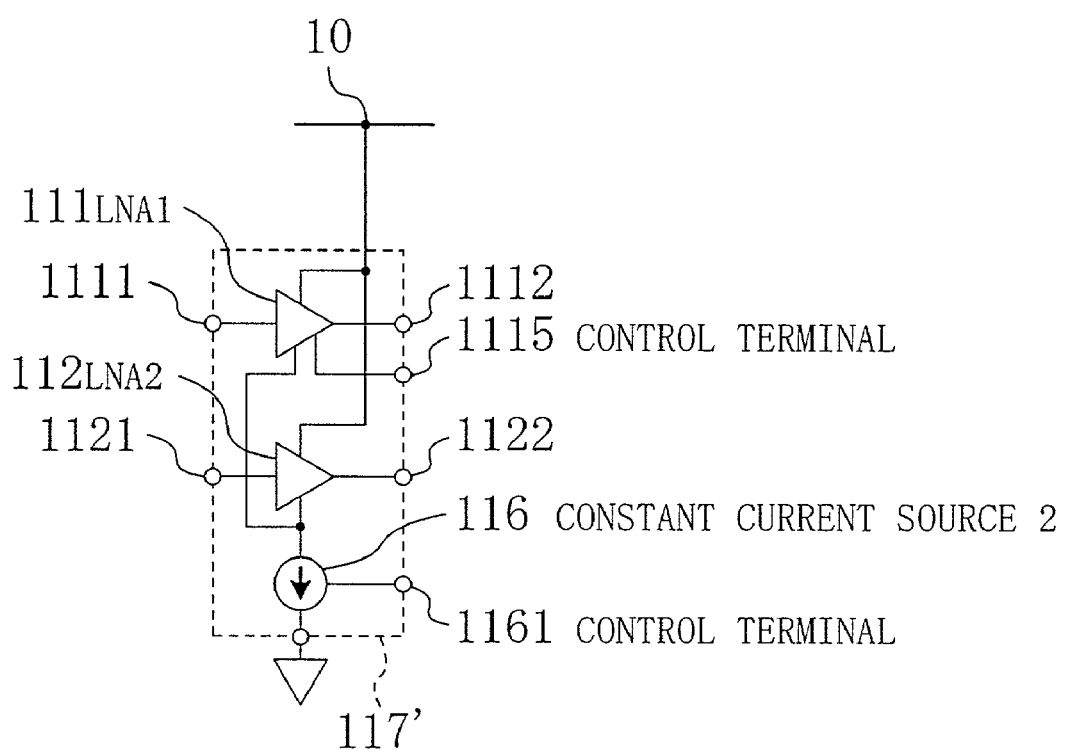
FIG. 16 is a diagram illustrating a configuration of an LNA block of a dual-band portable telephone according to the eighth embodiment of the present invention.

FIG. 16 illustrates a configuration of an LNA block according to the eighth embodiment of the present invention. In the present embodiment, the power supply SW 1114 of the first embodiment is not provided, and the function thereof is assigned to a constant current source 2 116.

Specifically, in FIG. 16, no power supply SW is provided. Moreover, the constant current source 2 116 has a control terminal 1161, and the potential of the control terminal 1161 is low during signal transmission and high during signal reception. The output current value of the constant current source 2 116 is "0" when the potential of the control terminal 1161 is low, and is equal to the constant current value 11 when the potential of the control terminal 1161 is high. The constant current source 2 116 having a control terminal is sealed in a single package together with the two LNAs 111 and 112 to form a single device 117'.

Therefore, as compared with the first embodiment, the present embodiment provides the special effect that the power supply SW 1114 is eliminated, requiring no power supply SW at all, and the LNA block can be provided by using only one device 117'.

Figure 17:
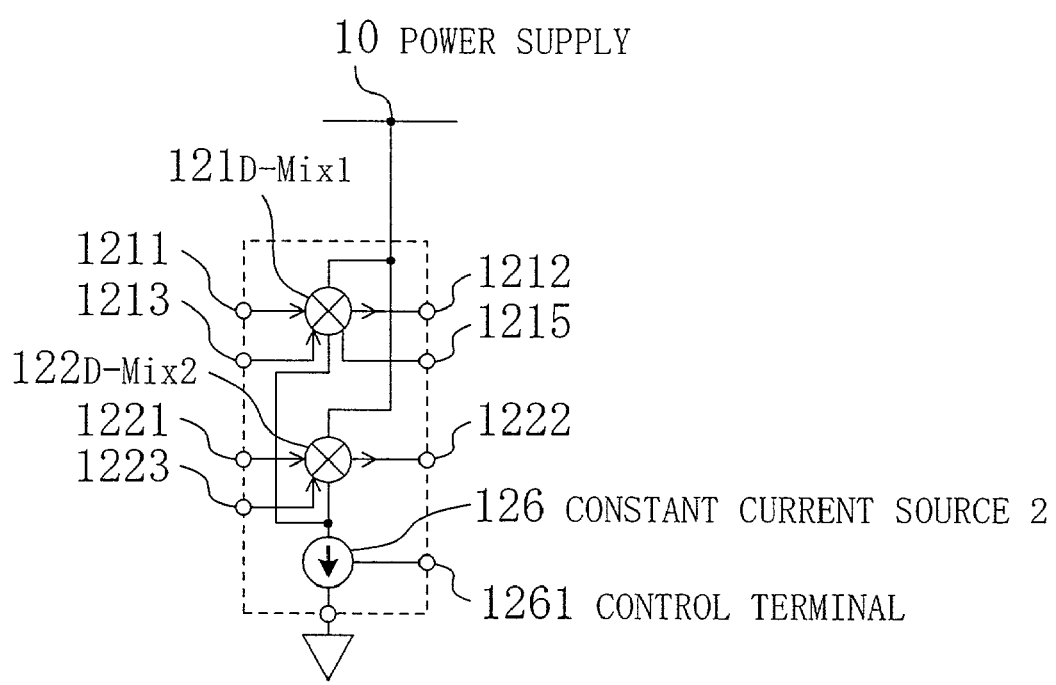
FIG. 17 is a diagram illustrating a first variation of the embodiment.
Figure 18:
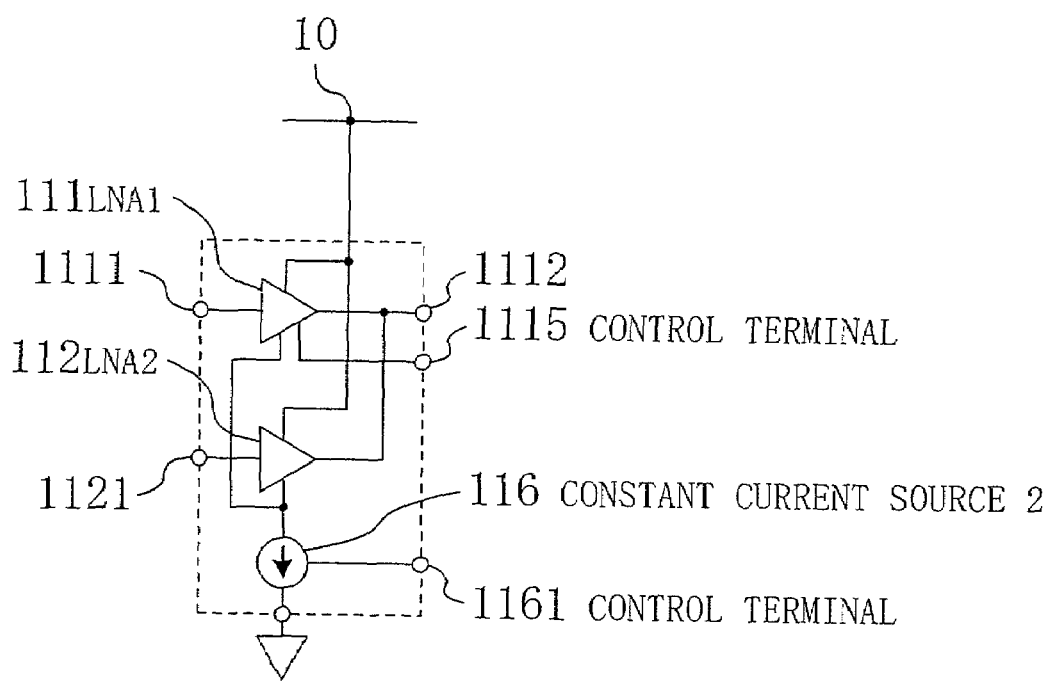
FIG. 18 is a diagram illustrating a second variation of the embodiment.
Figure 19:
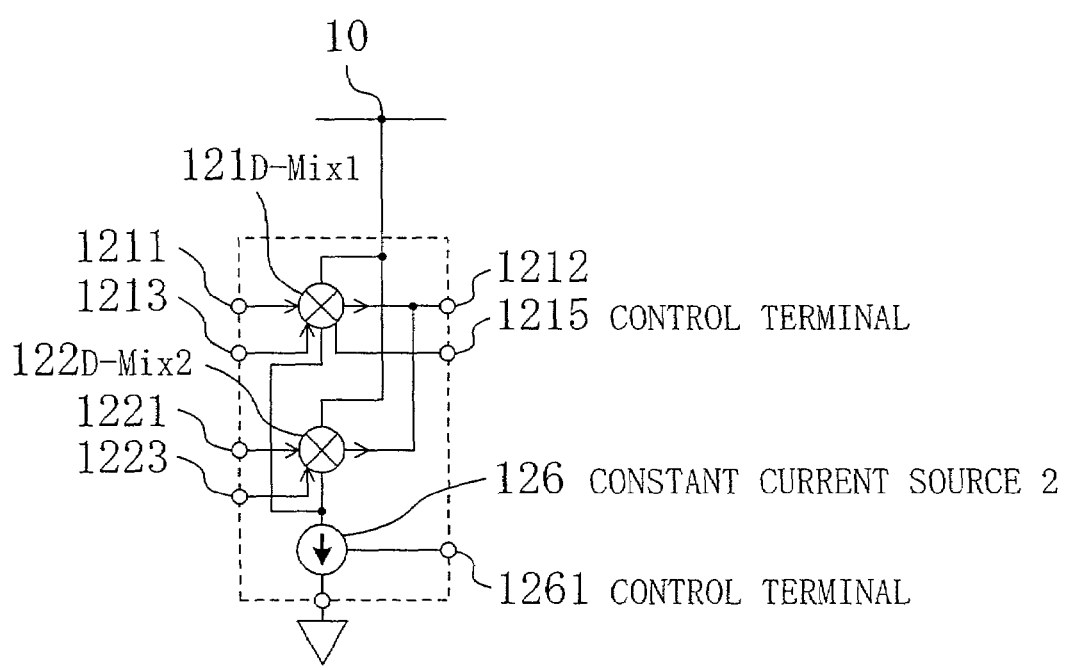
FIG. 19 is a diagram illustrating a third variation of the embodiment.

FIG. 17 illustrates a first variation of the present embodiment. This variation is similar to the variation of the fourth embodiment except that the power supply SW 1214 is not provided, and the constant current source 1 125 is replaced by a constant current source 2 126 having the control terminal 1261.

FIG. 18 to FIG. 29 respectively illustrate second to thirteen variations of the present embodiment. These variations respectively correspond to the configurations of FIG. 4 to FIG. 15 described above, except that no power supply SW is provided, and the constant current source is provided by using the constant current source 2 116 having the control terminal 1161 or the constant current source 2 126 having a control terminal 1261. Therefore, there is provided the special effect that the LNA block or the D-mix block can be provided by using only one device as in the present embodiment.

Figure 20A:
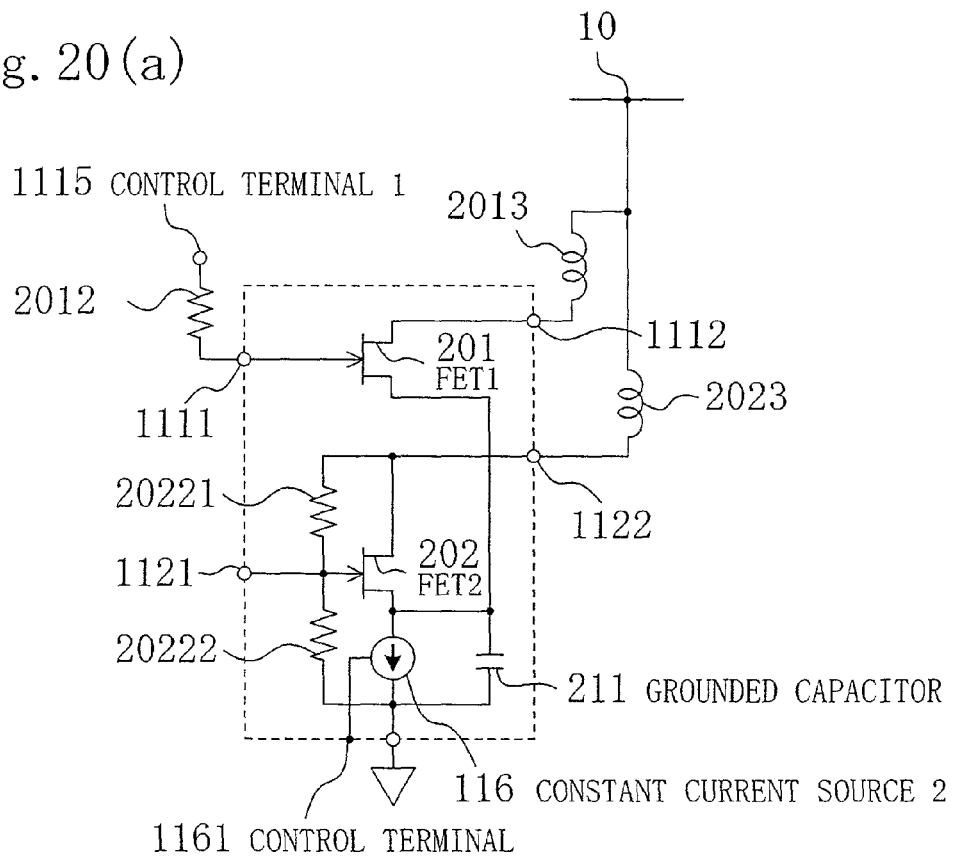
FIG. 20(a) is a diagram illustrating a fourth variation of the embodiment.
Figure 20B:
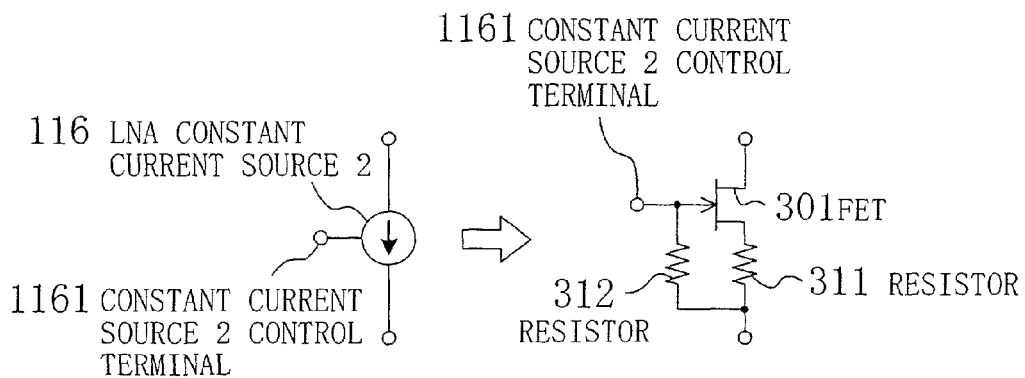
FIG. 20(b) is a diagram illustrating a specific example of a constant current source having a control terminal.
Figure 21:
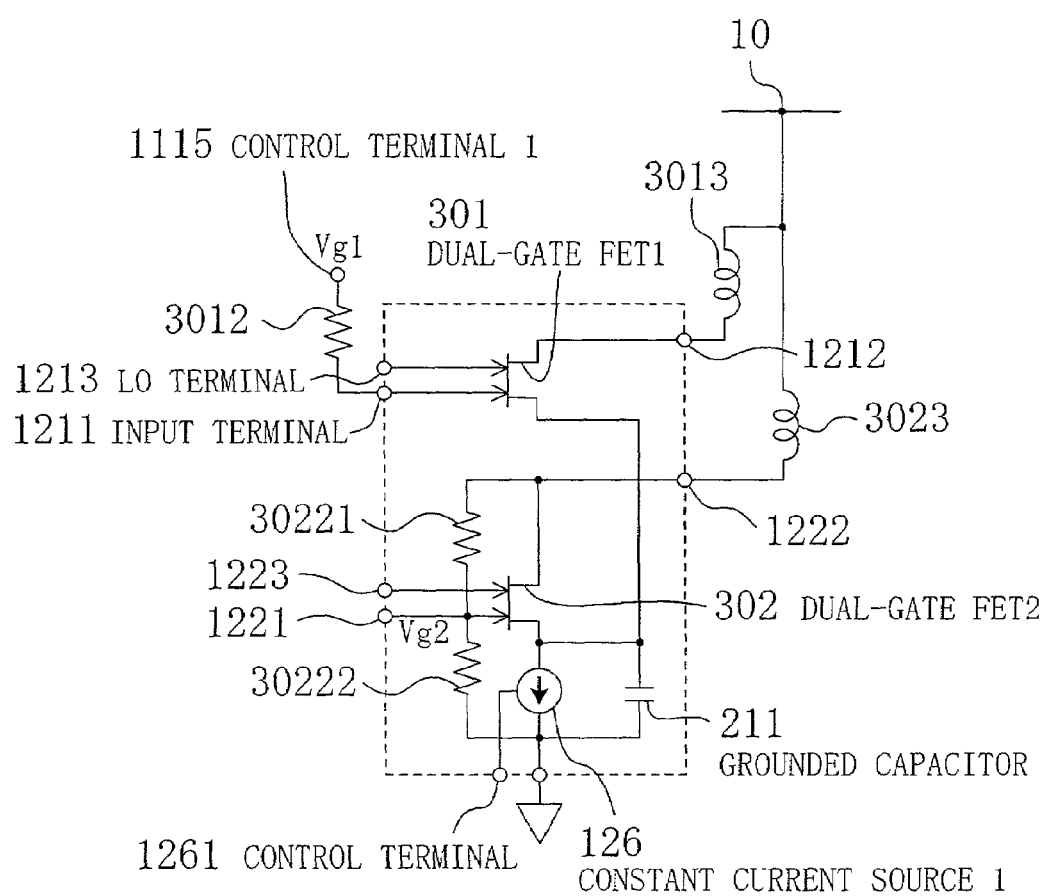
FIG. 21 is a diagram illustrating a fifth variation of the embodiment.
Figure 22:
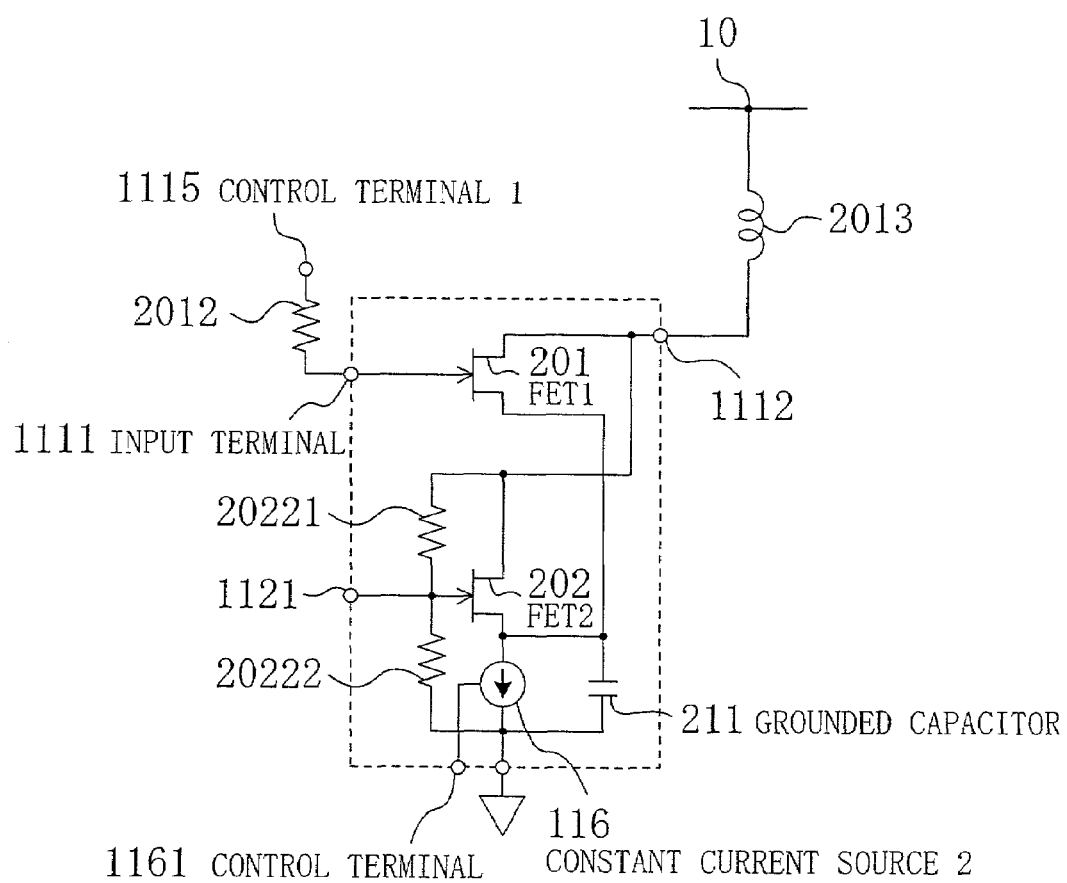
FIG. 22 is a diagram illustrating a sixth variation of the embodiment.
Figure 23:
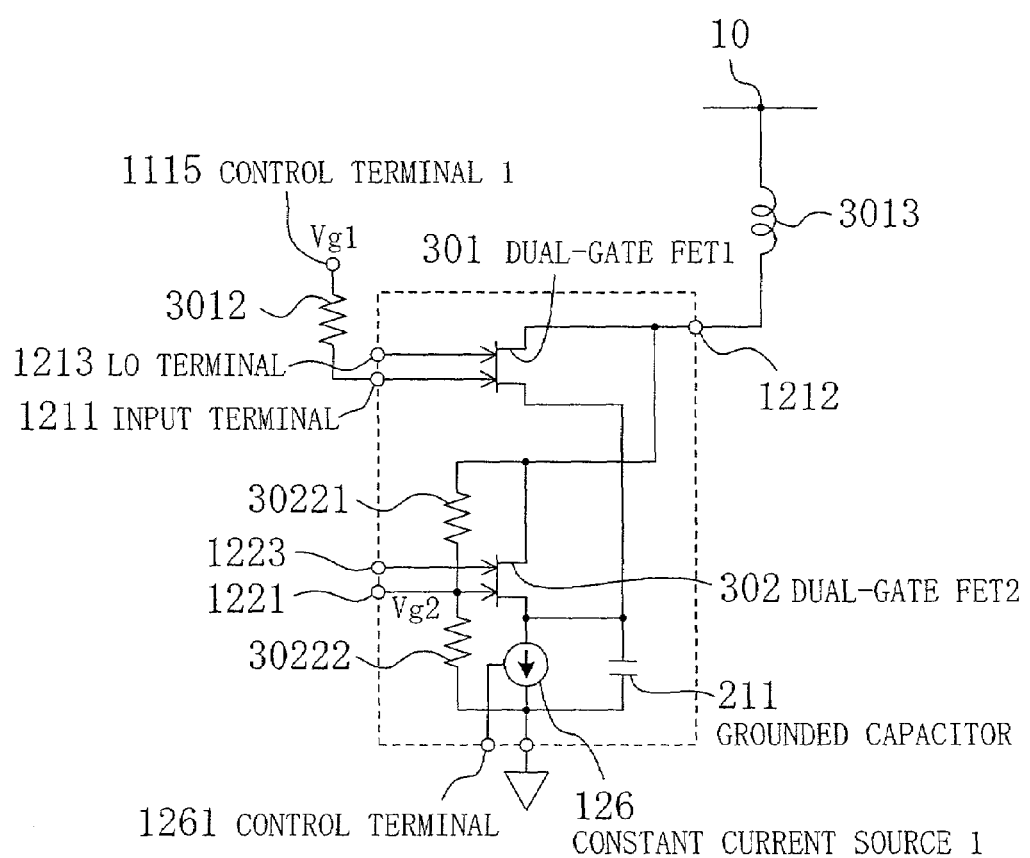
FIG. 23 is a diagram illustrating a seventh variation of the embodiment.
Figure 24:
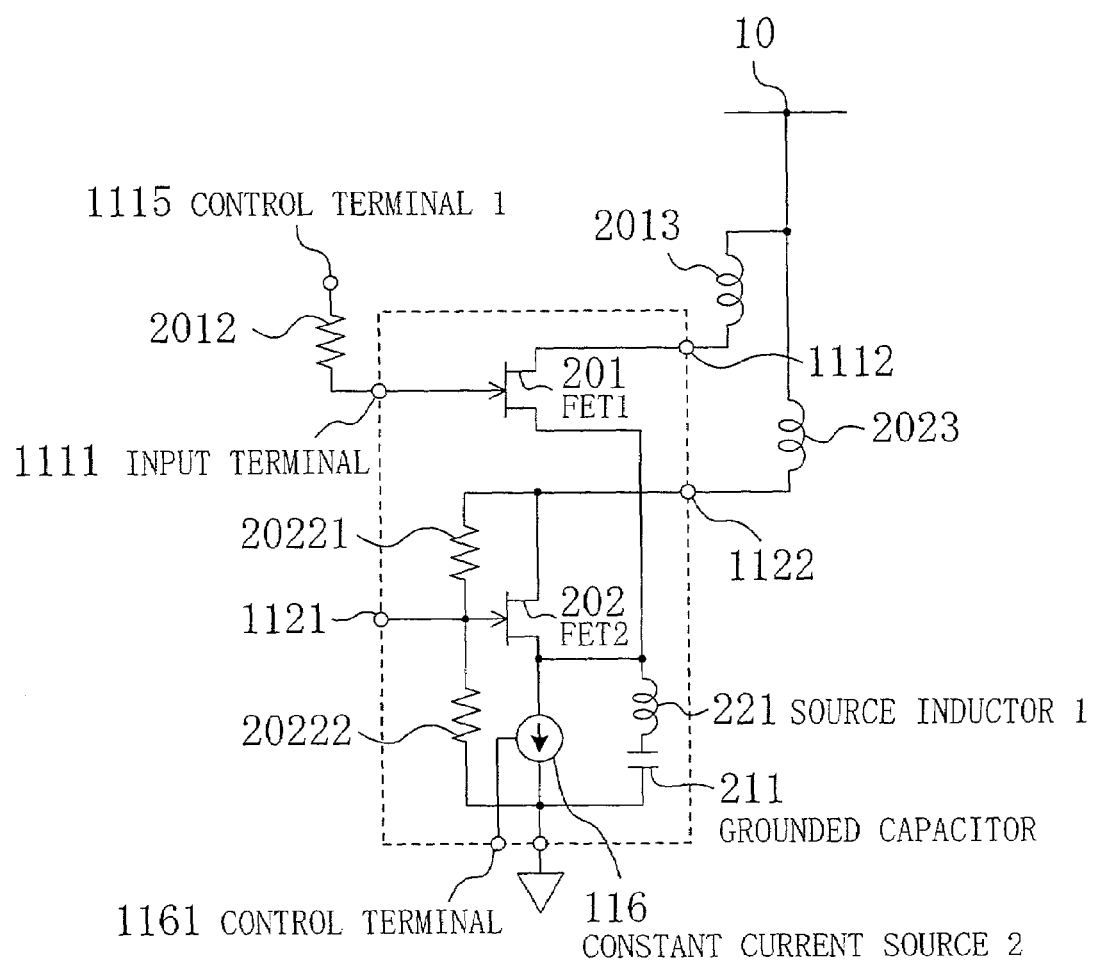
FIG. 24 is a diagram illustrating an eighth variation of the embodiment.
Figure 25:
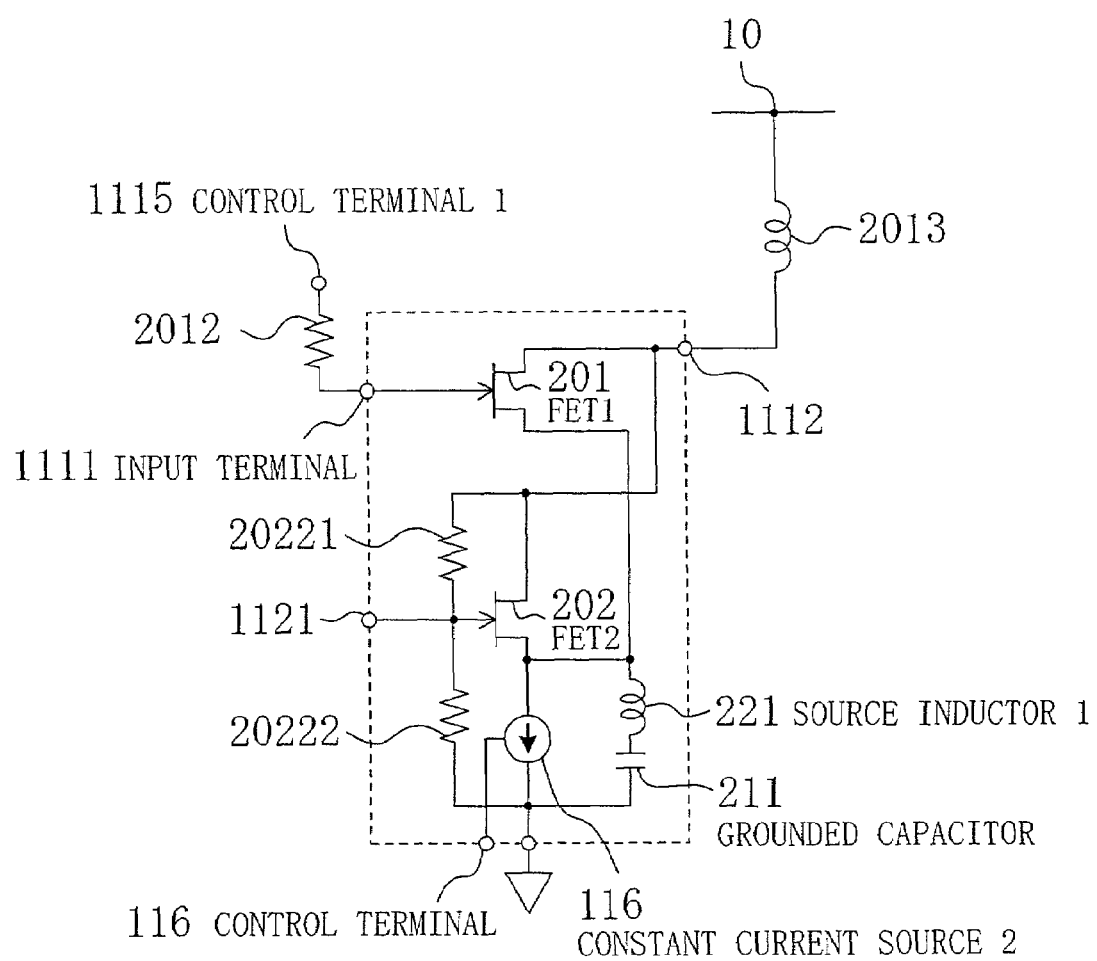
FIG. 25 is a diagram illustrating a ninth variation of the embodiment.
Figure 26:
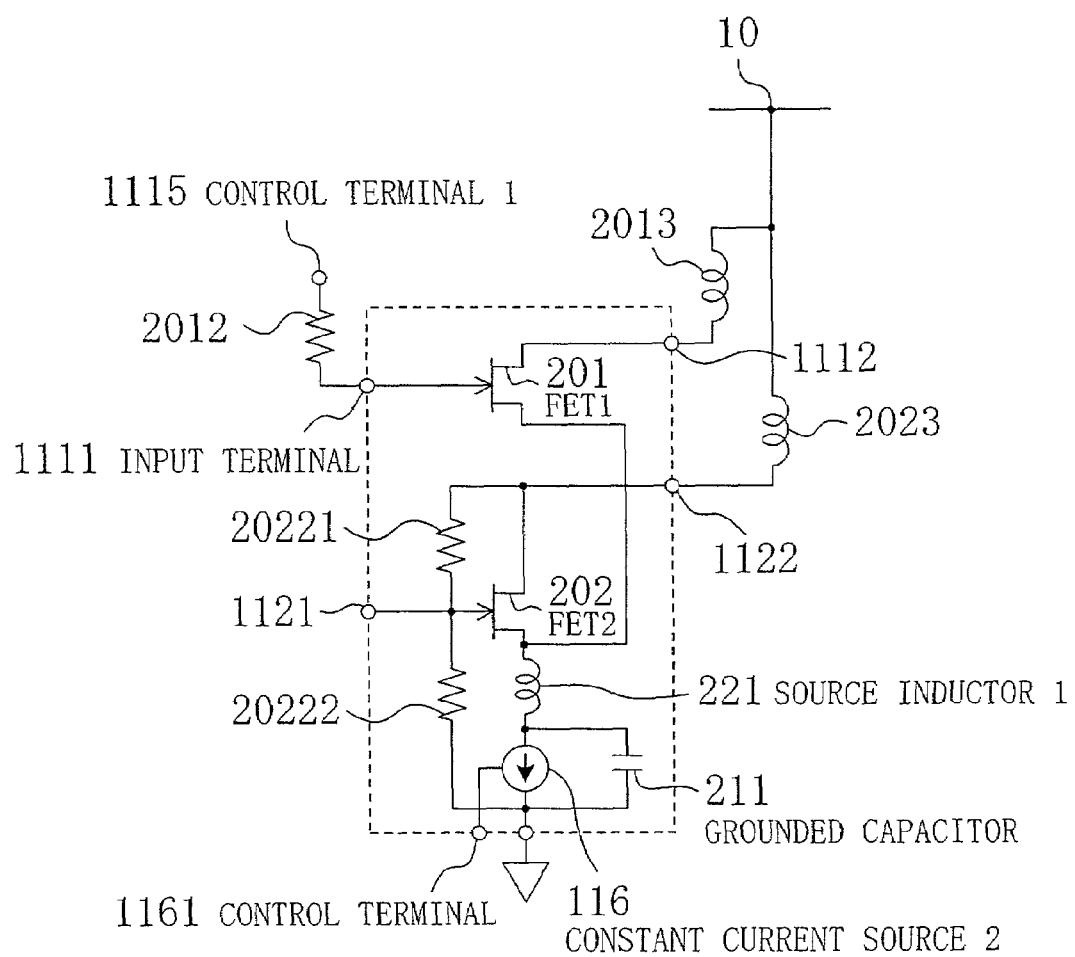
FIG. 26 is a diagram illustrating a tenth variation of the embodiment.
Figure 27:
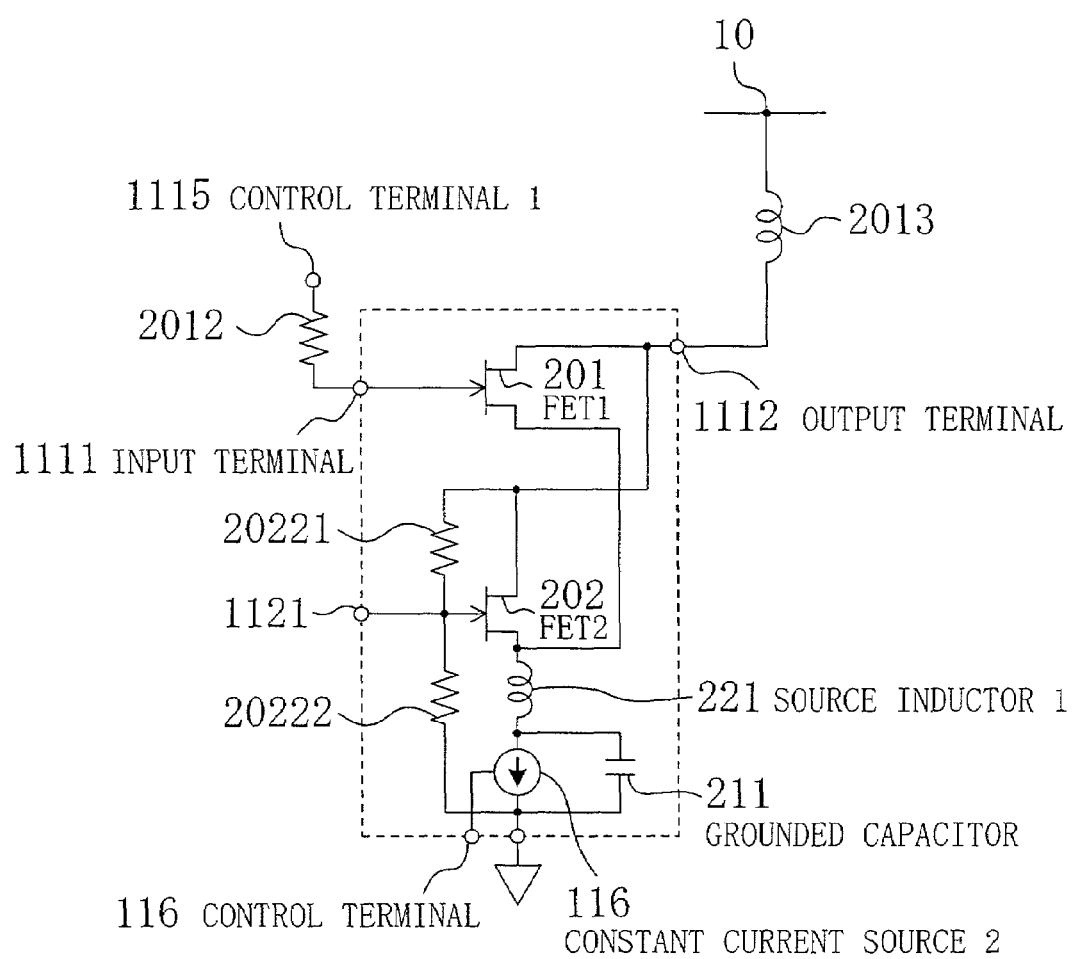
FIG. 27 is a diagram illustrating an eleventh variation of the embodiment.
Figure 28:
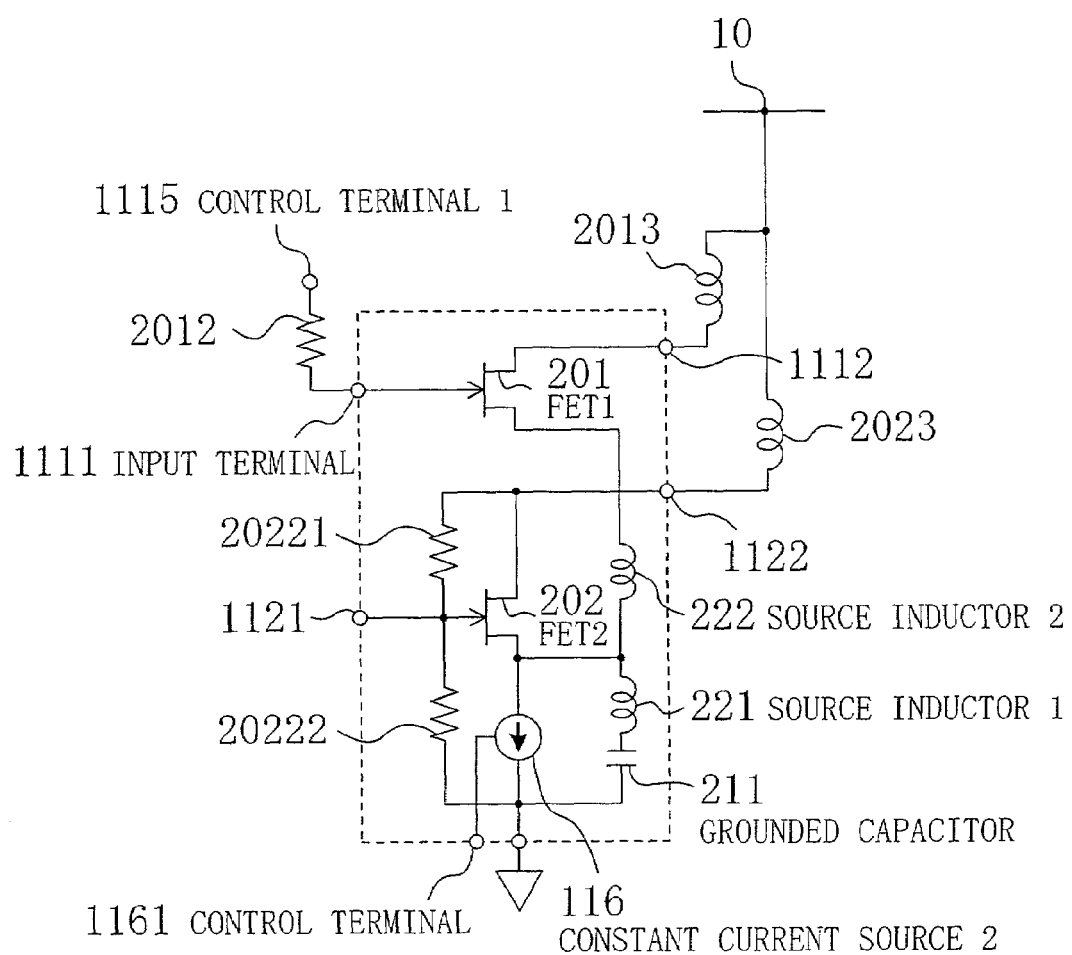
FIG. 28 is a diagram illustrating a twelfth variation of the embodiment.
Figure 29:
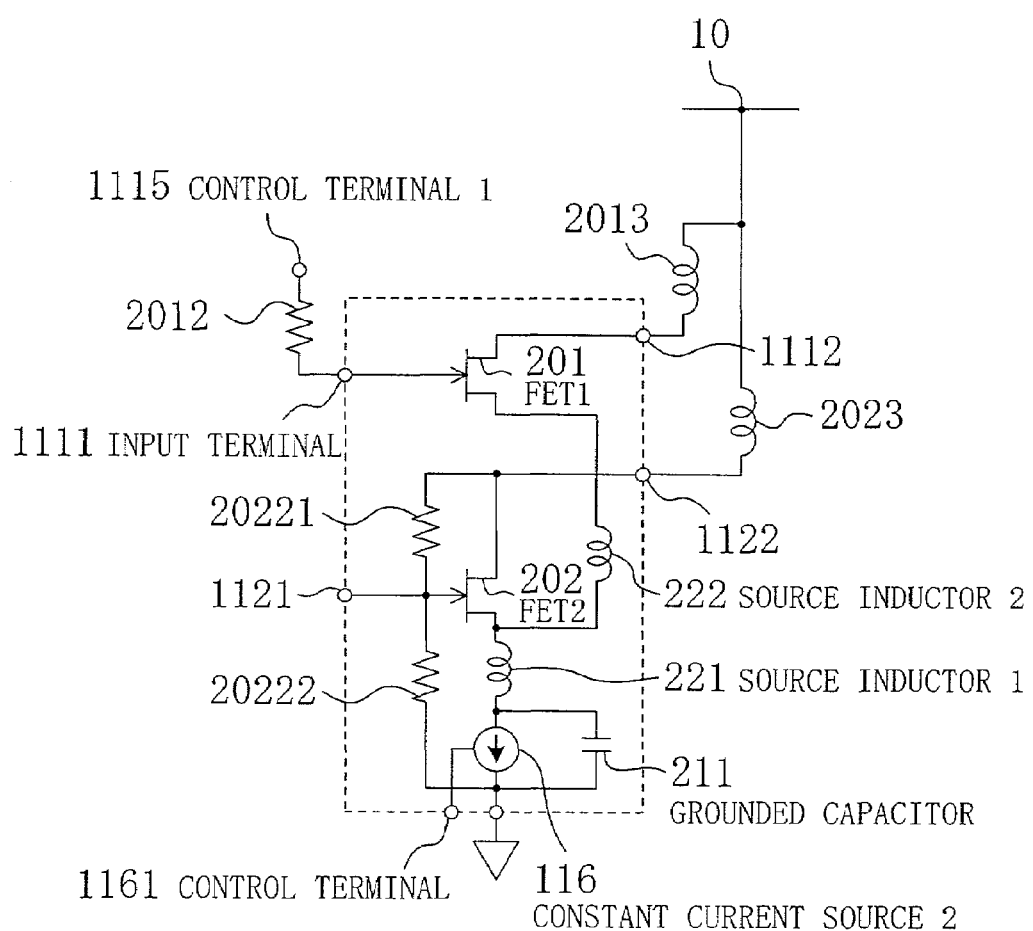
FIG. 29 is a diagram illustrating a thirteenth variation of the embodiment.

An exemplary specific configuration of the constant current source 2 116 having the control terminal 1161 or the constant current source 2 126 having the control terminal 1261 is illustrated in FIG. 20(b). The specific configuration of FIG. 20(b) is similar to that of the constant current source 1 115 illustrated in FIG. 6(b) except that the gate terminal of the FET 301 is replaced by the control terminal 1161. In the constant current source 2 116, the current value needs to be "0" when the potential of the control terminal 1161 is low (0 v) and equal to the constant current value 11 when the potential of the control terminal 1161 is high. Therefore, the FET 301 of the constant current source 2 116 is provided by using an enhancement type FET whose current value is "0" when the gate voltage is "0" v. In such a case, the first FET1 201 and the second FET2 202 may be set to different threshold values Vth.

INDUSTRIAL APPLICABILITY

As described above, the semiconductor apparatus and the communication apparatus of the present invention are useful as portable terminals and particularly suitable for reducing the number of components, improving the high frequency characteristics, and providing both a low noise figure and a desirable input return loss in a field effect transistor.

What is claimed is:

1. A semiconductor apparatus, comprising, on a same semiconductor substrate:
   two or more semiconductor devices to which two or more signals having different frequency ranges are input, respectively; and
   a constant current source commonly connected to one ends of the semiconductor devices,
   wherein at least one of the semiconductor devices is provided with a control terminal for turning on/off the semiconductor device, and
   a constant current value of the constant current source is set to a current value needed for the semiconductor device requiring a lowest distortion among the two or more semiconductor devices.

2. The semiconductor apparatus of claim 1,
   wherein each of the semiconductor devices is a power amplification device.

3. The semiconductor apparatus of claim 1,
   wherein each of the semiconductor devices is a frequency conversion device.

4. The semiconductor apparatus of claim 2,
   wherein the power amplification device is provided by using a field effect transistor.

5. The semiconductor apparatus of claim 3,
   wherein the frequency conversion device is provided by using a dual-gate type field effect transistor.

6. The semiconductor apparatus of claim 1, 2 or 3, comprising
   a power supply switch commonly connected to other ends of the semiconductor devices.

7. The semiconductor apparatus of claim 1, 2 or 3,
   wherein the constant current source is provided by using a field effect transistor and a resistor.

8. The semiconductor apparatus of claim 1, 2 or 3,
   wherein the two or more semiconductor devices and the constant current source are sealed in a same package.

9. The semiconductor apparatus of claim 1, 2 or 3,
wherein output terminals of the two or more semiconductor devices are commonly connected and shared, with an output side return loss being less than or equal to −6 dB over an entire extent of each frequency range.

10. The semiconductor apparatus of claim 4 or 5,
wherein a grounded capacitor is connected in parallel to the constant current source.

11. The semiconductor apparatus of claim 10,
wherein an impedance value of the grounded capacitor for a frequency of the signal having a lowest frequency range among the two or more input signals is set to be sufficiently small for an impedance value of the constant current source.

12. The semiconductor apparatus of claim 10,
wherein an inductor is connected to a source of the field effect transistor.

13. The semiconductor apparatus of claim 12,
wherein the inductor is arranged in series with the grounded capacitor.

14. The semiconductor apparatus of claim 1, 2 or 3,
wherein the constant current source is provided with a control terminal for turning on/off the constant current source.

15. A communication apparatus, comprising a semiconductor apparatus of claim 1 and an antenna,
wherein the two or more signals having different frequency ranges that are received by the antenna are input to the respective semiconductor devices, or two or more signals having different frequency ranges that have been processed by the semiconductor devices are output from the antenna.

\* \* \* \* \*

UNITED STATES PATENT AND TRADEMARK OFFICE
CERTIFICATE OF CORRECTION

PATENT NO. : 7,079,860 B1
APPLICATION NO. : 09/913886
DATED : July 18, 2006
INVENTOR(S) : Shinji Yamamoto et al.

It is certified that error appears in the above-identified patent and that said Letters Patent is hereby corrected as shown below:

On the title page of the Letters Patent,

Under section "(86) PCT No.:", change "PCT/JP00/05121" to -- PCT/JP00/01521 --

Under section "(75) Inventors:", change:

"Kaname Motoyoshi, Nishinomiya (JP)" to -- Kaname Motoyoshi, Hyogo (JP) --
"Shinji Fukumoto, Ibaraki (JP)" to -- Shinji Fukumoto, Osaka (JP) --
"Atsushi Watanabe, Kadoma (JP)" to -- Atsushi Watanabe, Osaka (JP) --

Signed and Sealed this

Seventeenth Day of April, 2007

JON W. DUDAS
*Director of the United States Patent and Trademark Office*